(12) United States Patent
Woo et al.

(10) Patent No.: US 11,262,019 B2
(45) Date of Patent: Mar. 1, 2022

(54) DISPLAY APPARATUS

(71) Applicant: SAMSUNG ELECTRONICS CO., LTD., Suwon-si (KR)

(72) Inventors: Byungmin Woo, Suwon-si (KR); Chulyong Cho, Suwon-si (KR); Soonsuk Seo, Seoul (KR); Taehun Kim, Suwon-si (KR); Jaeneung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/585,136

(22) Filed: Sep. 27, 2019

(65) Prior Publication Data

US 2020/0208772 A1 Jul. 2, 2020

(30) Foreign Application Priority Data

Dec. 31, 2018 (KR) .......................... 10-2018-0173872

(51) Int. Cl.
| | | |
|---|---|---|
| *F16M 11/18* | (2006.01) | |
| *H05K 5/00* | (2006.01) | |
| *H05K 5/02* | (2006.01) | |
| *F16M 11/04* | (2006.01) | |
| *F16M 11/10* | (2006.01) | |

(52) U.S. Cl.
CPC .......... *F16M 11/18* (2013.01); *F16M 11/046* (2013.01); *F16M 11/10* (2013.01); *H05K 5/0017* (2013.01); *H05K 5/0234* (2013.01); *H05K 5/0247* (2013.01)

(58) Field of Classification Search
CPC ...... F16M 11/18; F16M 11/046; F16M 11/10; F16M 11/041; F16M 13/00; F16M 11/105; F16M 13/022; F16M 11/04; F16M 11/06; H05K 5/0017; H05K 5/0234; H05K 5/0247; H04M 1/0237; H04M 1/0227; H04M 1/04; G06F 2200/1614; G06F 1/1601; G09F 9/00; G09F 9/35
See application file for complete search history.

(56) References Cited

U.S. PATENT DOCUMENTS

| | | |
|---|---|---|
| 7,336,478 B2 | 2/2008 | Jang |
| 7,448,580 B2 | 11/2008 | Shimizu et al. |
| 7,490,796 B2 | 2/2009 | Kim |

(Continued)

FOREIGN PATENT DOCUMENTS

| | | |
|---|---|---|
| CN | 1650337 A | 8/2005 |
| CN | 1734680 A | 2/2006 |

(Continued)

OTHER PUBLICATIONS

Translation of KR20100008659 (Year: 2010).*

(Continued)

*Primary Examiner* — Abhishek M Rathod
(74) *Attorney, Agent, or Firm* — Sughrue Mion, PLLC

(57) ABSTRACT

A display includes a display, a stand, and a connecting member arranged between the display and the stand. The connecting member guides the display to transition between a first position in which the display is in a first orientation, a second position in which the display moves in a vertical direction relative to the stand, and a third position in which the display is rotated to a second orientation.

14 Claims, 23 Drawing Sheets

(56) References Cited

U.S. PATENT DOCUMENTS

| | | |
|---|---|---|
| 7,963,488 B2 | 6/2011 | Hasegawa et al. |
| 8,139,171 B2 | 3/2012 | Osada et al. |
| 9,282,670 B2 | 3/2016 | Chiang |
| 2005/0205731 A1 | 9/2005 | Shimizu et al. |
| 2006/0033847 A1 | 2/2006 | Kim |
| 2006/0175476 A1* | 8/2006 | Hasegawa .............. F16M 11/28 248/125.1 |
| 2007/0064379 A1* | 3/2007 | Shin ..................... F16M 11/105 361/679.06 |
| 2007/0064380 A1* | 3/2007 | Shin ................... F16M 11/2064 361/679.07 |
| 2007/0195495 A1 | 8/2007 | Kim et al. |
| 2008/0051162 A1* | 2/2008 | Kim .................... H04M 1/0247 455/575.3 |
| 2008/0236014 A1* | 10/2008 | Chao .................... F16M 11/105 40/747 |
| 2008/0303805 A1* | 12/2008 | Chien ................ F16M 11/2021 345/204 |
| 2009/0225239 A1 | 9/2009 | Osada et al. |
| 2009/0237420 A1* | 9/2009 | Lawrenz ............... G06F 1/1613 345/649 |
| 2010/0188804 A1 | 7/2010 | Jang et al. |
| 2014/0029176 A1 | 1/2014 | Chiang |
| 2015/0076308 A1 | 3/2015 | Hung et al. |
| 2015/0211675 A1* | 7/2015 | Shyu .................... F16M 11/105 248/125.7 |
| 2019/0317549 A1* | 10/2019 | Gurr ..................... G06F 1/1601 |

FOREIGN PATENT DOCUMENTS

| | | | |
|---|---|---|---|
| CN | 1805057 A | 7/2006 | |
| CN | 202141979 U | 2/2012 | |
| CN | 103576765 A | 2/2014 | |
| CN | 104214491 B | 8/2017 | |
| CN | 108353142 A | 7/2018 | |
| EP | 1420327 A1 | 5/2004 | |
| EP | 3444798 A1 * | 2/2019 | .......... G09G 3/2092 |
| KR | 10-0534120 B1 | 12/2005 | |
| KR | 10-2007-0033210 A | 3/2007 | |
| KR | 10-0954935 B1 | 4/2010 | |
| KR | 20-2010-0008659 U | 9/2010 | |
| KR | 10-1507435 B1 | 3/2015 | |
| KR | 10-1600925 B1 | 3/2016 | |
| WO | 2006/137543 A1 | 12/2006 | |
| WO | 2017082571 A1 | 5/2017 | |

OTHER PUBLICATIONS

Communication dated Apr. 22, 2020, issued by the European Patent Office in counterpart European Application No. 19200527.0.

International Search Report (PCT/ISA/210) dated Jan. 16, 2020, issued by International Searching Authority in counterpart International Application No. PCT/KR2019/012684.

Written Opinion (PCT/ISA/237) dated Jan. 16, 2020, issued by the International Searching Authority in counterpart International Application No. PCT/KR2019/012684.

Communication dated May 28, 2021 issued by the National Intellectual Property Administration of P.R. China in Chinese Application No. 201910922313.5.

* cited by examiner

DISPLAY APPARATUS

CROSS-REFERENCE TO RELATED APPLICATION(S)

This application is based on and claims priority under 35 U.S.C. § 119(a) from Korean Patent Application No. 10-2018-0173872, filed on Dec. 31, 2018, in the Korean Intellectual Property Office, the disclosure of which is incorporated by reference herein in its entirety.

BACKGROUND

1. Field

The disclosure relates to a display apparatus providing improved convenience in usage and utilization.

2. Description of Related Art

A display apparatus is an apparatus for reproducing image contents, and may include various apparatuses such as televisions, computer monitors, smartphones, and other mobile apparatuses including tablets, etc.

Recently, with the development of mobile technologies, image contents specialized for mobile apparatuses or image contents generated at mobile apparatuses have become increasingly studied. Image contents specialized for mobile apparatuses may be formatted, produced, or designed for reproduction on mobile devices typically oriented by a user in a vertical direction. For example, videos and self-images (selfies) may be frequently captured in portrait orientation owing to ease of holding the mobile apparatus in a corresponding vertical orientation. On the other hand, conventional display apparatuses may be formed to be long in a horizontal direction. As a result, the screen ratios of image contents specialized for mobile apparatuses may not be most optimally displayed on conventional display apparatuses owing to a screen ratio mismatch between mobile apparatuses and conventional display apparatuses. Conversely, image contents intended to be displayed by conventional display apparatuses may not be most optimally displayed on mobile display apparatuses, owing to the screen ratio mismatch.

Accordingly, it is difficult for a user to view image contents specialized for mobile apparatuses through a display apparatus formed to be long in a horizontal direction, e.g., an apparatus such as a television. Also, although a user may view image contents by using a screen rotation function of a mobile apparatus, image contents still might not be optimally displayed.

SUMMARY

Aspects of the disclosure relate to a display apparatus providing improved convenience in usage and utilization.

According to an aspect of the disclosure, there is provided a display apparatus including a display, a stand configured to support the display, and a connecting member configured to connect a rear of the display to the stand, wherein the connecting member is configured to guide the display to move relative to the stand between: a first position in which the display obscures the stand from view of a user of the display apparatus, a second position in which the display is moved from the first position in a vertical direction relative to the stand and a lower portion of the stand is exposed to the view of the user of the display apparatus, and a third position in which the display is rotated relative to the stand.

The display apparatus may further include a speaker arranged in the lower portion of the stand, and in the first position, the display obscures the lower portion of the stand including the speaker from the view of the user of the display apparatus, and in the second position and the third position, the display does not obscure the lower portion of the stand including the speaker is from the view of the user of the display apparatus.

Meanwhile, the connecting member may include a knob coupled with one surface of the connecting member, and the stand may include a guide member in which a guide slot into which the knob is inserted and moves is formed. Also, the guide slot may include a first portion formed in the vertical direction to guide the display to move in the vertical direction relative to the stand, and a second portion connected to an upper end of the first portion and configured to guide the display to rotate relative to the stand.

In the first position, the knob may be located in the lower end of the first portion, and in the second position, the knob may be located between the first portion and the second portion, and in the third position, the knob may be located on a terminating end of the second portion.

Meanwhile, the stand may further include a pair of guide rails that are arranged in a vertical direction. Also, the connecting member may include a vertical moving member coupled with the pair of guide rails and configured to move in the vertical direction, and a rotating member that is rotatively coupled with the vertical moving member, wherein, the knob is arranged on a first surface of the rotating member, and the display is coupled on a second surface of the rotating member opposing the first surface.

The rotating member may include a rotating part inserted into a rotation hole formed on the vertical moving member and configured to rotate, and a coupling part formed integrally with the rotating part and to which the display is coupled.

The display apparatus may further include a connecting ring arranged between the rotation hole and the rotating part and configured to connect the rotation hole and the rotating part.

The stand may further include a driving part connected with the connecting member and configured to move the connecting member between the first position, the second position, and the third position. The driving part may include a motor and a driving belt connected with the motor, and arranged in parallel with the pair of guide rails.

The vertical moving member may further include a belt insertion part arranged on one side thereof, and the driving belt may be inserted into the belt insertion part and move in a vertical direction.

The display apparatus may further include a belt coupling part that is coupled with the belt insertion part, and wherein a coupling gear is formed. The driving belt may be coupled with the coupling gear, and the belt coupling part and the driving belt may move integrally.

The stand may further include a frame member arranged along an edge of the stand and a supporting member connected with the frame member, and configured to support the connecting member in the first position.

Meanwhile, the second portion may be in the form of an arc equal to or smaller than 180 degrees.

The pair of guide rails may be arranged to constitute symmetry with the guide member at the center.

Also, the rotating part and the vertical moving member may be located on the same plane.

Meanwhile, the display apparatus may include a cable connecting the display and the driving board, and the rotating part may include a wiring hole formed in the center portion of the rotating part, and the cable may pass through the wiring hole.

DETAILED DESCRIPTION

Hereinafter, embodiments of the disclosure will be described with reference to the accompanying drawings, for comprehensive understanding of the constitution and the effect of the disclosure. The disclosure is not limited to the embodiments described herein, but may be implemented in various forms, and various modifications may be made to the embodiments of the disclosure. The descriptions of the embodiments of the disclosure are provided to make the descriptions of the disclosure complete, and to apprise people having ordinary knowledge in the technical field to which the disclosure belongs to fully understand the range of the disclosure. Meanwhile, in the accompanying drawings, components were illustrated in more enlarged sizes greater than their actual sizes for the convenience of description, and the proportion of each component may be exaggerated or reduced.

Herein, a component described as "on top of" or "contacts" another component should be understood to impart that a component may directly contact or be connected with the top portion of another component, but still another component may exist between the components. In contrast, a component described as "just on top of" or "directly contacts" another component should be understood to impart that still another component does not exist between the components. Other expressions describing relations between components, for instance, expressions such as "between ~" and "directly between ~" may be interpreted in the same manner.

Meanwhile, terms such as "the first," "the second," and the like may be used to describe various components, but the components are not limited by the terms. Such terms as labels are used only to distinguish one component from another component. For example, a first component may be called a second component, and a second component may be called a first component in a similar manner, without departing from the scope of the disclosure.

Also, singular expressions include plural expressions, unless defined obviously differently in the context. Further, in this specification, terms such as "include" or "have" should be construed as designating that there are such characteristics, numbers, steps, operations, elements, components or a combination thereof described in the specification, and they may be interpreted to denote that one or more of other characteristics, numbers, steps, operations, elements, components or a combination thereof may be added.

Further, the terms used in the embodiments of the disclosure may be interpreted as meanings generally known to those of ordinary skill in the art described in the disclosure, unless defined differently in the disclosure.

Hereinafter, the configuration of the display apparatus 1 according to an embodiment of the disclosure will be described with reference to FIGS. 1A to 2B.

Figure 1A:
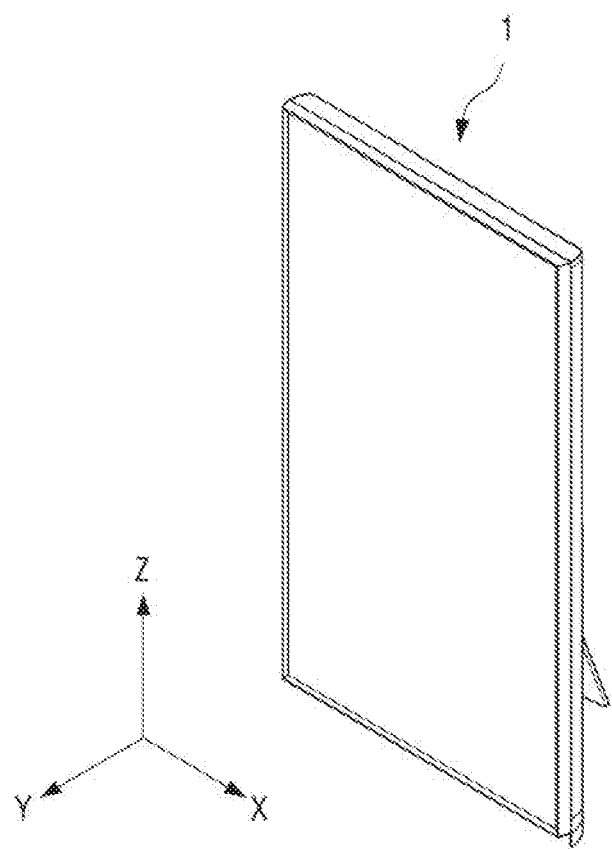
FIG. 1A is a combined front perspective view illustrating a display apparatus according to an embodiment of the disclosure.
Figure 1B:
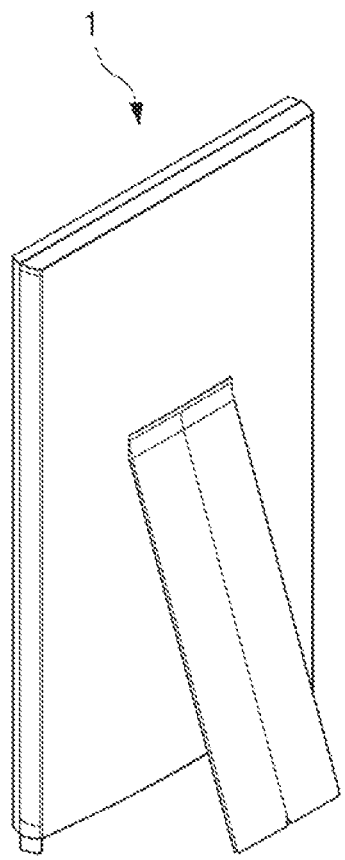
FIG. 1B is a combined rear perspective view illustrating a display apparatus according to an embodiment of the disclosure.
Figure 2A:
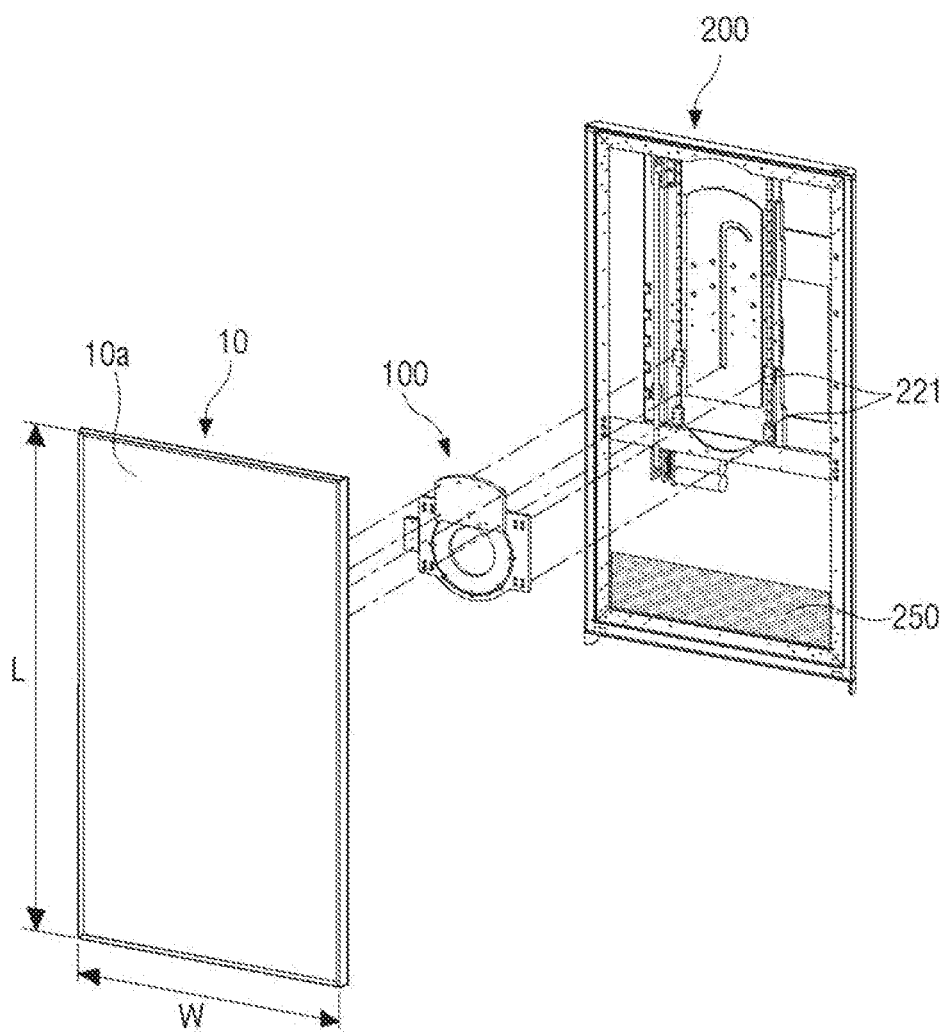
FIG. 2A is an exploded perspective view of the display apparatus illustrated in FIG. 1A according to an embodiment of the disclosure.
Figure 2B:
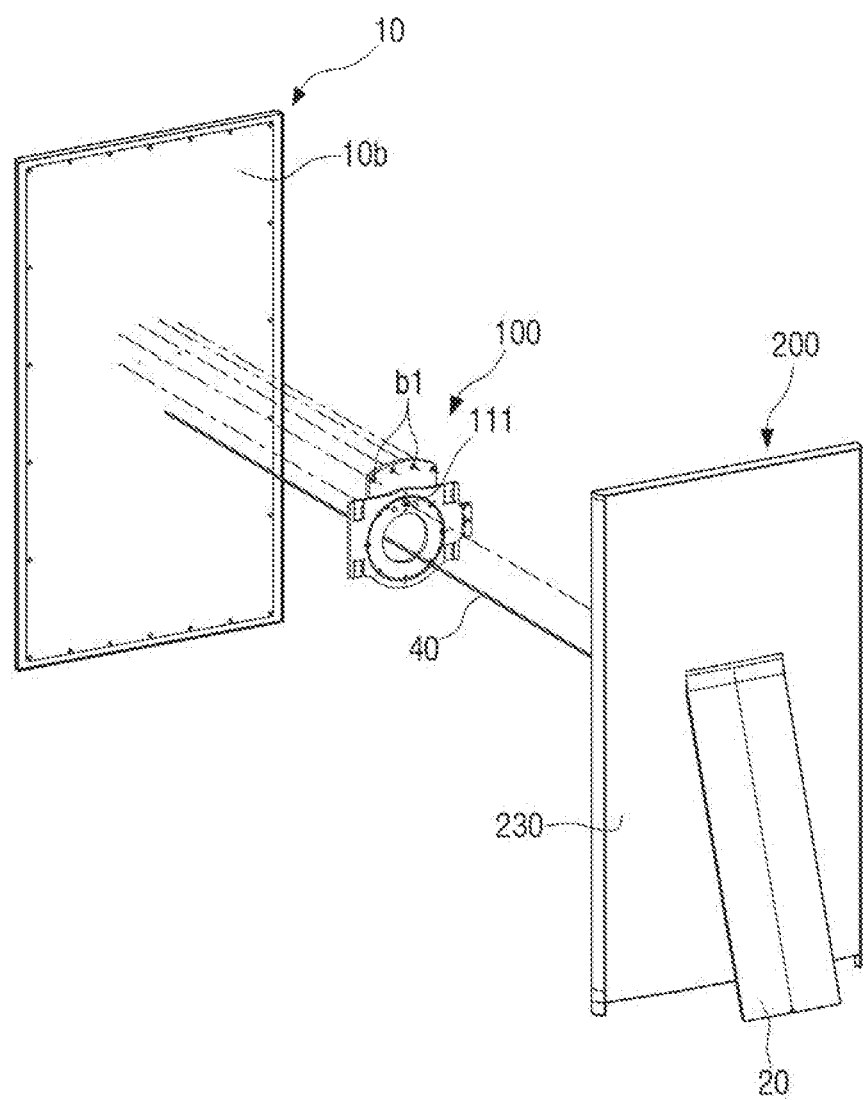
FIG. 2B is an exploded perspective view of the display apparatus illustrated in FIG. 1B according to an embodiment of the disclosure.
Figure 2C:
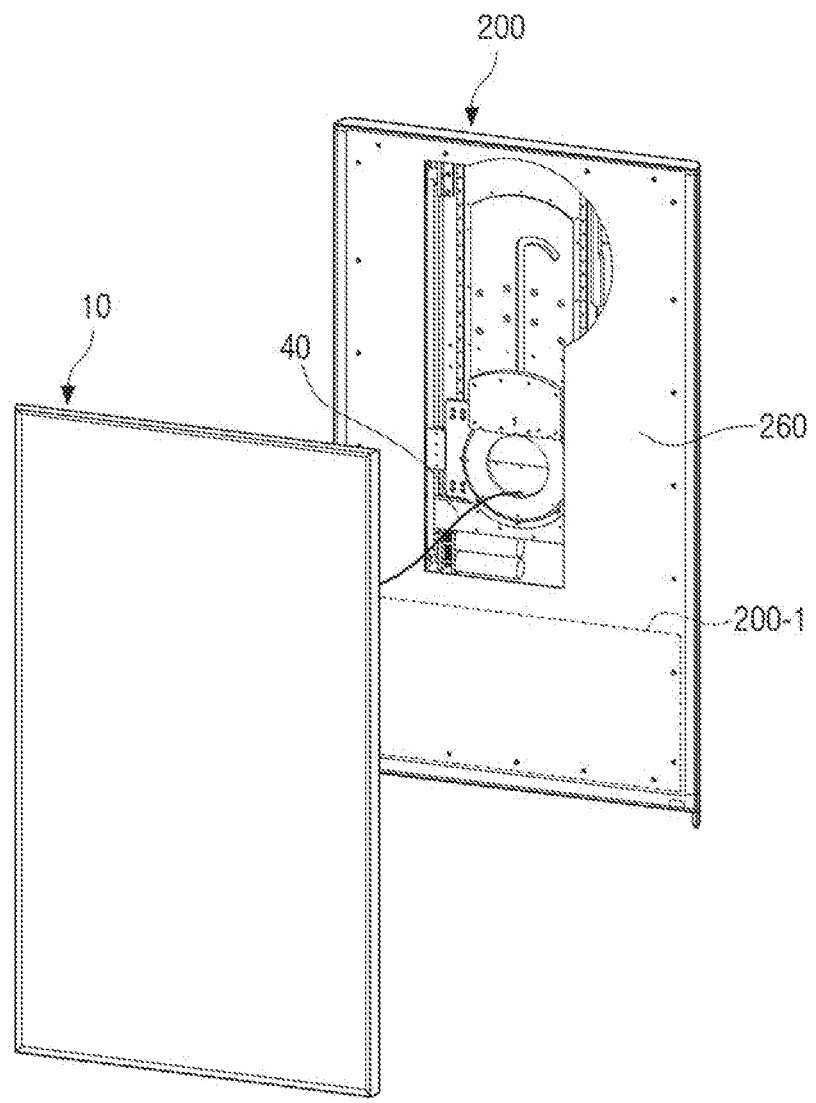
FIG. 2C is an exploded perspective view illustrating an arrangement of a cover member on a stand in FIG. 1B according to an embodiment of the disclosure.
Figure 2D:
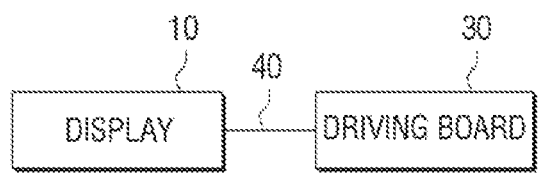
FIG. 2D is a block diagram illustrating a display and a driving board according to an embodiment of the disclosure.

FIG. 1A is a combined front perspective view illustrating the display apparatus 1 according to an embodiment of the disclosure. FIG. 1B is a combined rear perspective view illustrating the display apparatus 1 according to an embodiment of the disclosure. FIG. 2A is an exploded perspective view of the display apparatus 1 illustrated in FIG. 1A. FIG. 2B is an exploded perspective view of the display apparatus 1 illustrated in FIG. 1B. FIG. 2C is an exploded perspective view illustrating arrangement of a cover member 260 on a stand 200 in FIG. 1B. FIG. 2D is a block diagram illustrating a display 10 and a driving board 30.

The display apparatus 1 is an apparatus that implements an image content on the display 10. Here, as the display apparatus 1, a stand type having a support 20 supporting the display apparatus 1 is illustrated, but the display apparatus 1 may be a wall-hanging type in which the support 20 is omitted.

The display apparatus 1 that will be explained below is an apparatus that is capable of processing an image signal received from an image source, and visually displaying the processed image. The display apparatus 1 may be implemented in various forms such as a television, a monitor, a portable multimedia apparatus, a portable communication apparatus, a tablet, and a smartphone, and the form of the display apparatus 1 is not limited so as long the display apparatus 1 is an apparatus that visually reproduces an image for display thereon.

As illustrated in FIG. 2A, the display apparatus 1 may include a display 10, a stand 200 that that has a length L corresponding to the horizontal direction of the display 10, supports the display 10, and includes a driving board 30 that provides images to the display 10, and a connecting member 100 that is arranged between the display 10 and the stand 200 and connects the display 10 and the stand 200.

The display 10 may process, decode, or otherwise reproduce an image signal as an image that a user can visually recognize. Here, the display 10 may consist of various components including a liquid crystal display (LCD) including a backlight, or organic light emitting diodes (OLEDs) which are organic self-luminous elements, or micro light emitting diodes (LEDs) which are inorganic self-luminous elements.

Further, a first length L of the display 10 may be formed to be longer than a second length W. The first length may be generally referred to as a length L of the display, and the second length W may be generally referred to as a width of the display 10. For example, the first length L may be the vertical length of the display 10, and the second length may be the horizontal length of the display 10. That is, the vertical length of the display 10 illustrated in FIG. 2A may be formed to be longer than the horizontal length.

Figure 10A:
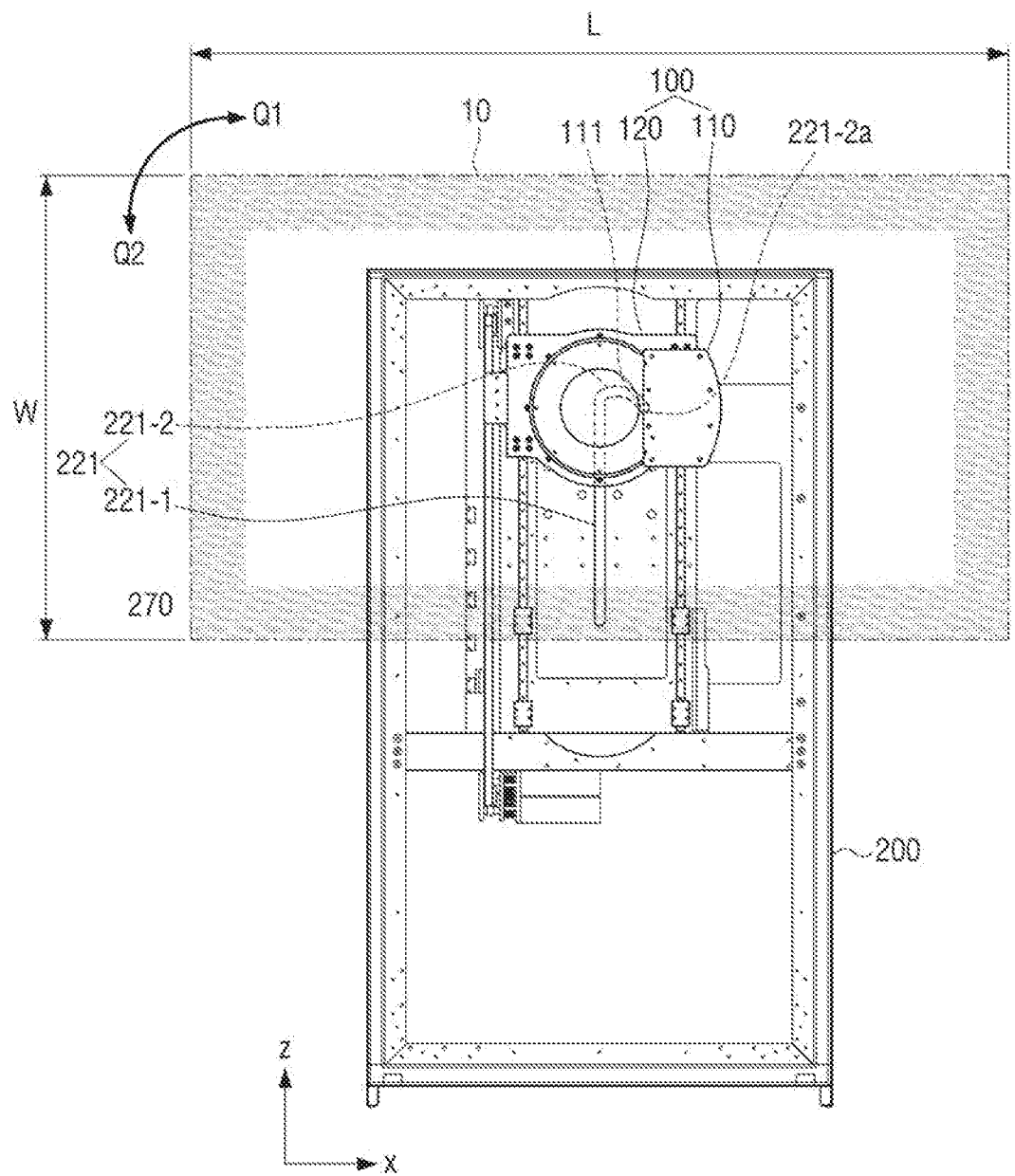
FIG. 10A is a front view of a display apparatus wherein a third position is indicated according to an embodiment of the disclosure.

Alternatively, as illustrated in FIG. 10A, when the display 10 is rotated to a rotated position, the first length L may be the horizontal length of the display 10, and the second length W may be the vertical length of the display 10 in the orientation of the rotated position.

The stand 200 may be arranged on the rear side of the display 10, and support the display 10. Also, the stand 200 may have a length corresponding to the horizontal length of the display 10. Similarly, the stand 200 may have a vertical length corresponding to the vertical length of the display 10. Accordingly, the horizontal length of the stand 200 and the horizontal length of the display 10 may correspond to each other in the first position and the second position, and thus a user may have an aesthetic sense that the appearance of the display apparatus 1 is neat.

In the first position, the display 10 may cover the lower area of one surface 200a of the stand 200. For example, as illustrated in FIG. 2C, in the first position, the display 10 may cover the lower surface 200-1 of the stand 200.

In addition, the stand 200 may have the same horizontal length and vertical length as those of the display 10. For example, the stand 200 may have the same first length L and second length W as those of the display 10. Specifically, in the stand 200, the first length L is the vertical length, and the second length W is the horizontal length.

Thus, in the first position, the display 10 may be matched with one surface 200a of the stand 200. Accordingly, a user may have an aesthetic sense that the appearance of the display apparatus 1 is neat, through a structure in which the display 10 and the stand 200 supporting the display 10 are matched in the first position.

Also, as illustrated in FIG. 2C, the stand 200 may include a cover member 260 covering one surface 200a of the stand 200. The cover member 260 may be coupled with a frame member 230 and a housing 240, and protect several mechanical components and the driving board 30 arranged inside the stand 200.

In addition, as illustrated in FIG. 2D, the stand 200 may include the driving board 30 providing an image to the display 10. The driving board 30 may receive an image signal from an image source, convert the image signal into information of an image to be displayed on the display 10, and transmit the information to the display 10 for display thereon.

Accordingly, the display 10 may implement a display screen through an electronic signal transmitted from the driving board 30.

Also, the display 10 may be connected with the driving board 30 through a cable 40. Here, the cable 40 may pass through a wiring hole S2 of a rotating part 110-1 and electrically connect the display 10 and the driving board 30.

In addition, the display 10 may be controlled through several electronic components arranged inside the stand 200, without being limited to the driving board 30.

Also, as the electronic components of the display 10 are arranged inside the stand 200, the weight of the display 10 may be reduced, and thus structural stability of the display apparatus 1 may be improved.

Hereinafter, a detailed configuration of a connecting member 100 according to an embodiment of the disclosure will be described with reference to FIGS. 3A to 4B.

Figure 3A:
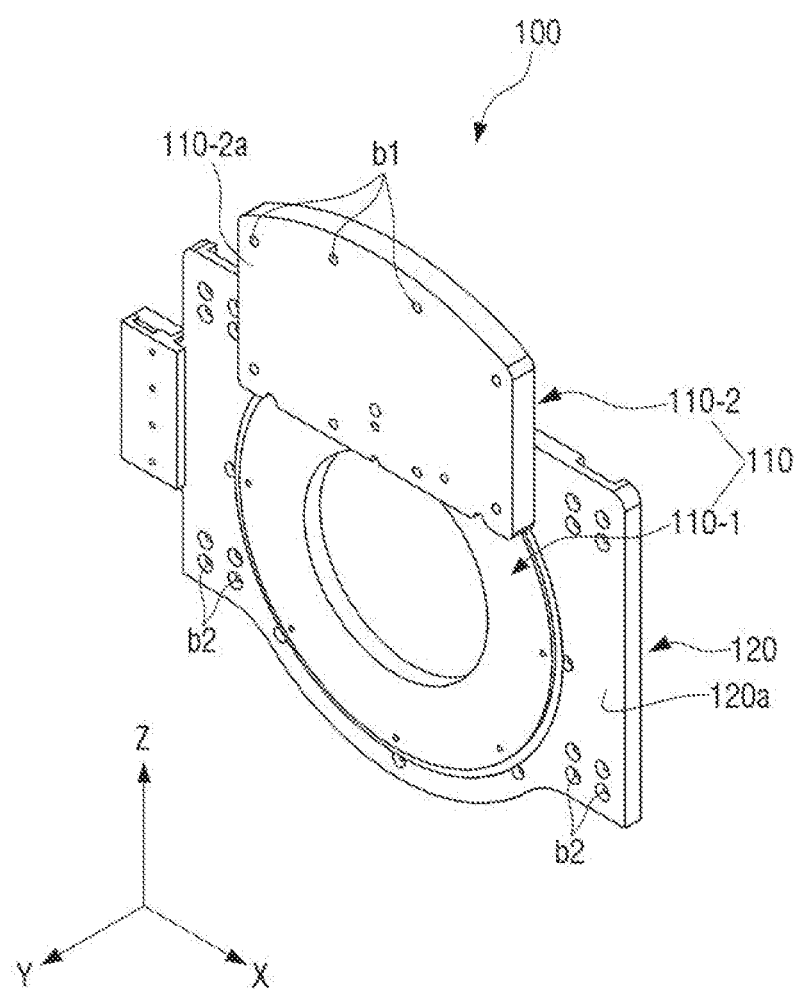
FIG. 3A is a combined front perspective view illustrating a connecting member according to an embodiment of the disclosure.
Figure 3B:
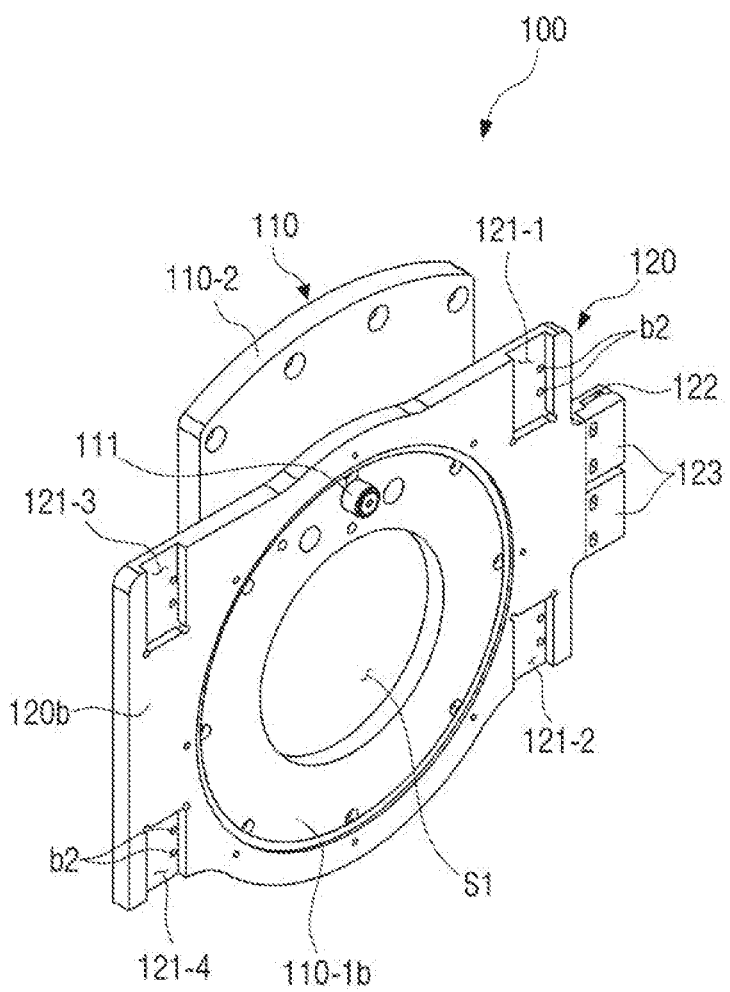
FIG. 3B is a combined rear perspective view illustrating a connecting member according to an embodiment of the disclosure.
Figure 4A:
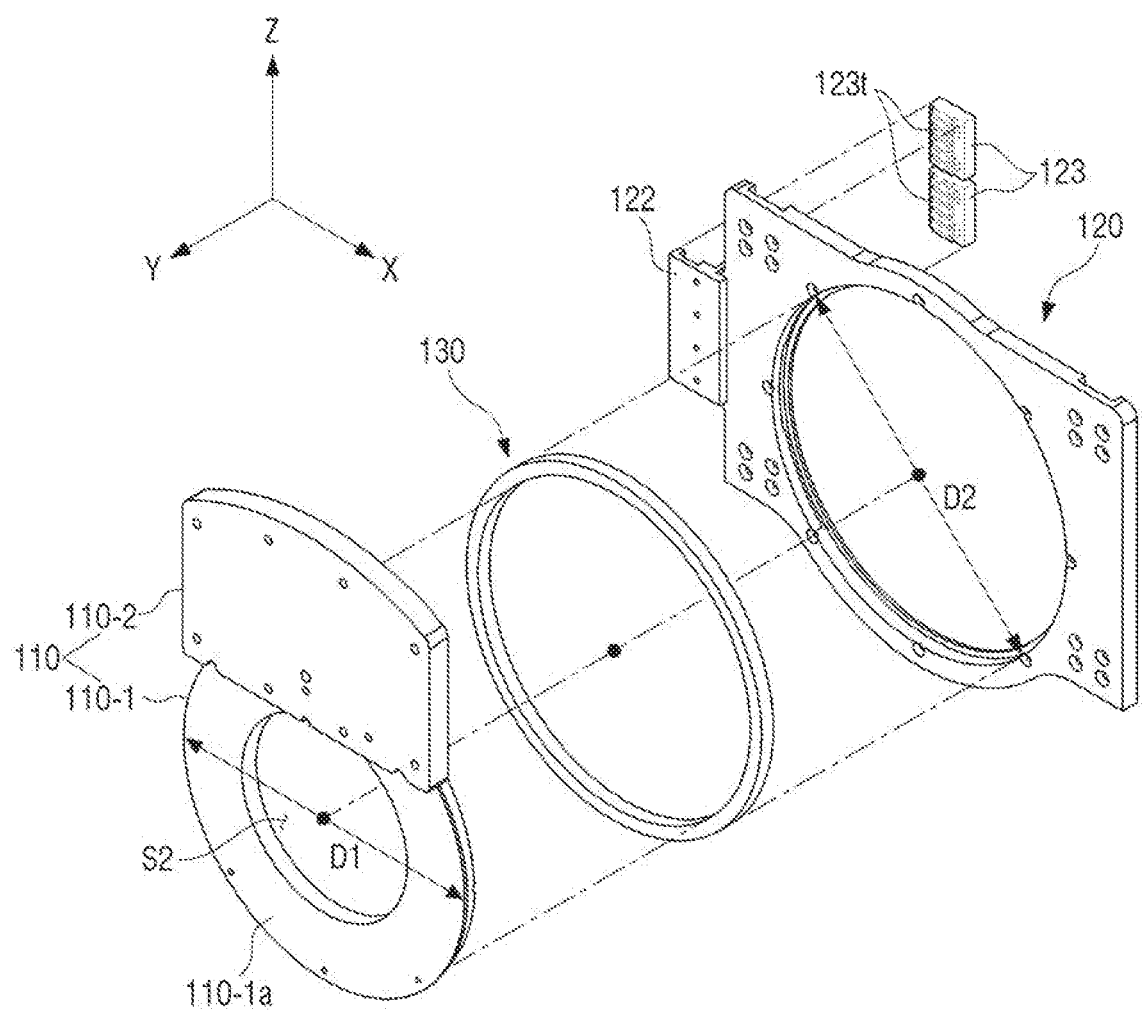
FIG. 4A is an exploded perspective view of the connecting member illustrated in FIG. 3A according to an embodiment of the disclosure.
Figure 4B:
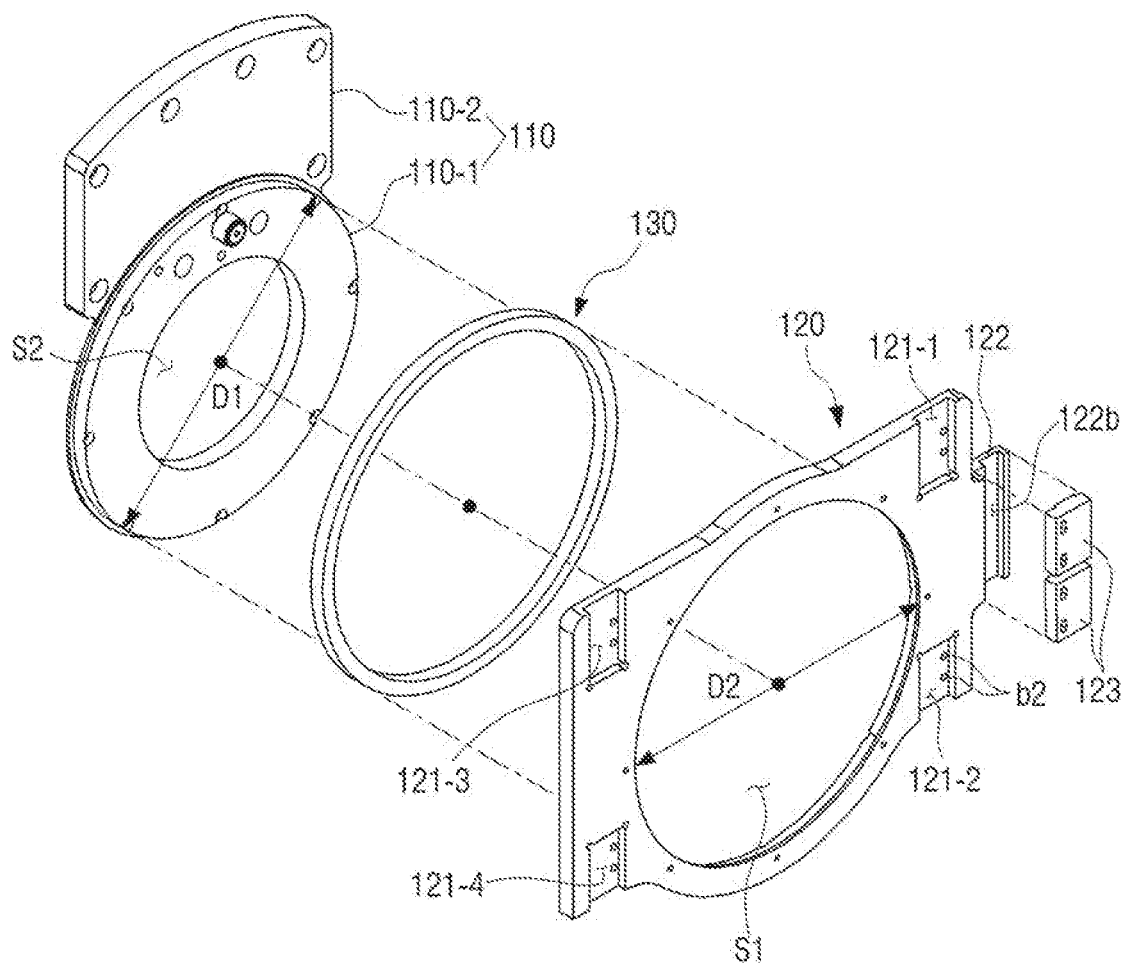
FIG. 4B is an exploded perspective view of the connecting member illustrated in FIG. 3B according to an embodiment of the disclosure.

FIG. 3A is a combined front perspective view illustrating a connecting member 100 according to an embodiment of the disclosure. FIG. 3B is a combined rear perspective view illustrating a connecting member 100 according to an embodiment of the disclosure. FIG. 4A is an exploded perspective view of the connecting member 100 illustrated in FIG. 3A. FIG. 4B is an exploded perspective view of the connecting member 100 illustrated in FIG. 3B.

The connecting member 100 may be coupled with each of the rear surface 10b of the display 10 and the guide rails 220 (refer to FIG. 5B) of the stand 200, and move and rotate the display 10 with respect to the stand 200.

Figure 8A:
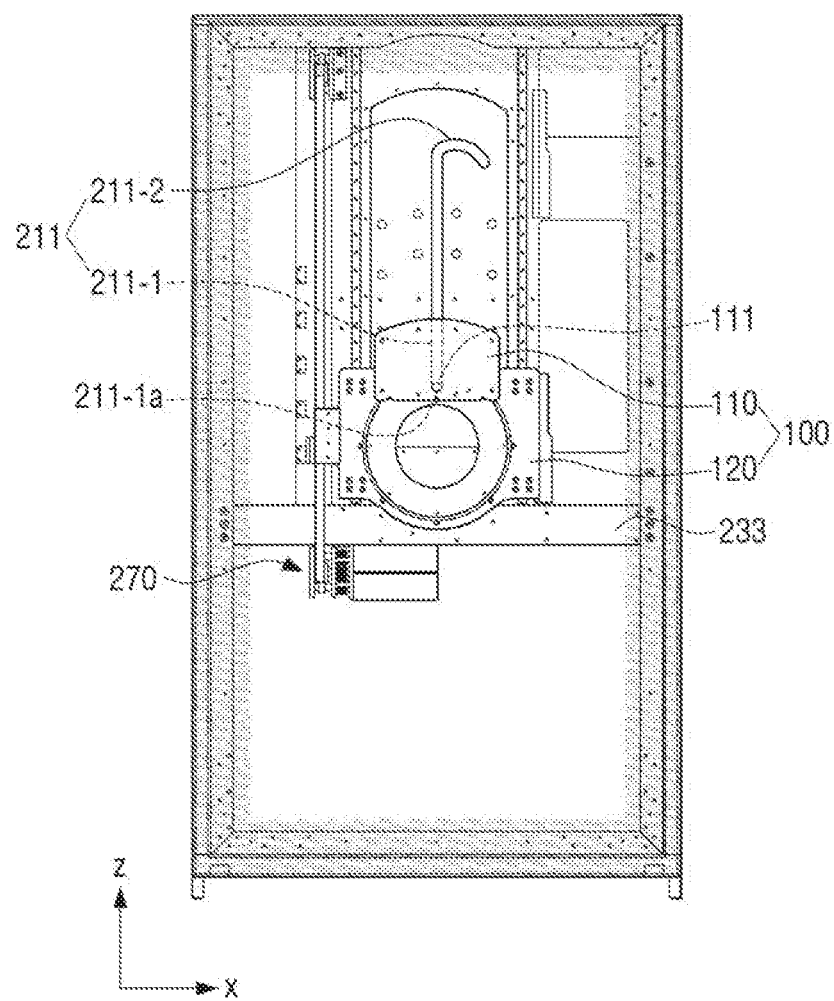
FIG. 8A is a front view of a display apparatus wherein a first position is indicated according to an embodiment of the disclosure.
Figure 9A:
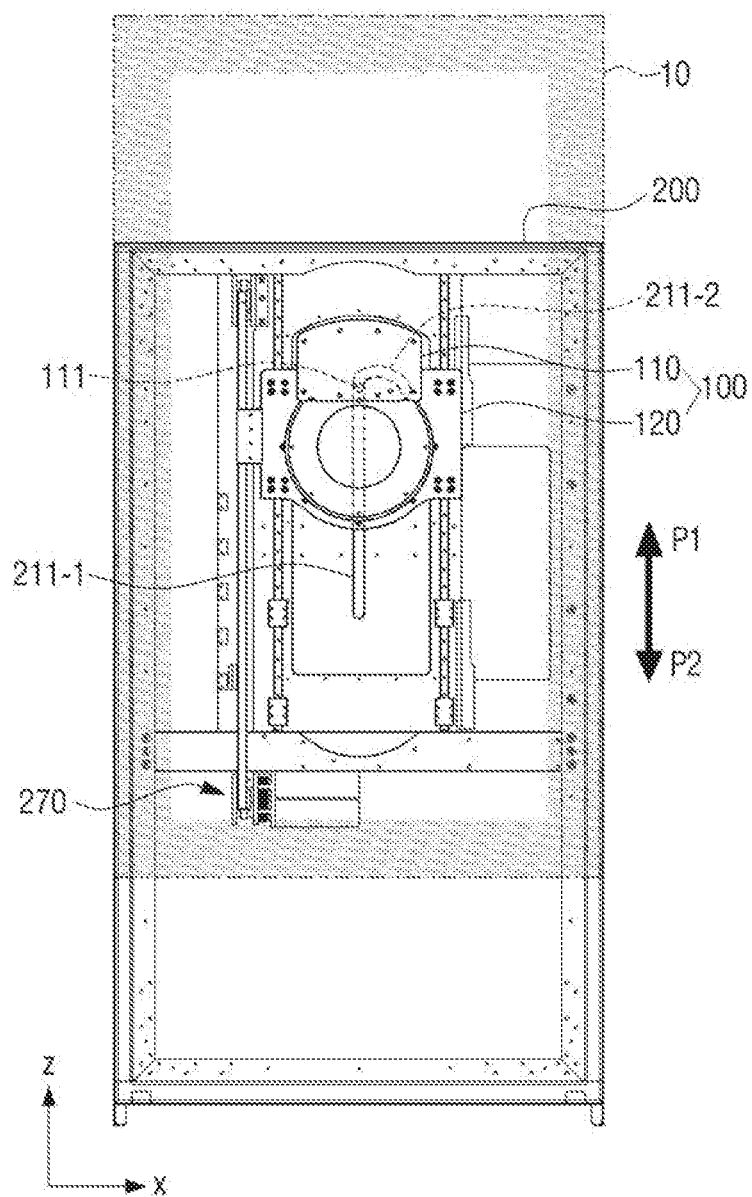
FIG. 9A is a front view of a display apparatus wherein a second position is indicated according to an embodiment of the disclosure.

For example, the connecting member 100 may guide the display 10 to move to a first position in which the display 10 covers one surface 200a of the stand 200, as illustrated in FIG. 8A, a second position in which the display 10 moves in a vertical direction P1 to the stand 200 from the first position and the lower surface 200-1 of the stand 200 is exposed, as illustrated in FIG. 9A, and a third position in which the display 10 is rotated in a predetermined direction Q1 from the second position, as illustrated in FIG. 10A.

That is, the connecting member 100 may connect the display 10 and the stand 200, and at the same time, move and rotate the display 10 with respect to the stand 200.

In addition, the connecting member 100 may include a vertical moving member 120 that is coupled with the stand 200 and move in a vertical direction to the stand 200, and a rotating member 110 that is rotatively or pivotably coupled with the vertical moving member 120 on the vertical moving member 120.

Here, the vertical direction may mean an up-down direction in the direction of the Z axis in FIG. 1A.

That is, the rotating member 110 may rotate the display 10 with respect to the stand 200, and the vertical moving member 120 may move the display 10 in a vertical direction with respect to the stand 200.

In addition, on one surface of the rotating member 110, a knob 111 may be arranged, and the other surface opposing the one surface may be coupled with the display 10. Specifically, on the rear surface 110-1b of the rotating part 110-1 of the rotating member 110, the knob 111 may be arranged, and the front surface 110-2a of the coupling part 110-2 of the rotating member 110 may be coupled with the display 10.

Here, one surface of the rotating member 110 may mean the rear surface 110-1b of the rotating part 110-1 of the rotating member 110, and the other surface of the rotating member 110 may mean the front surface 110-2a of the coupling part 110-2 of the rotating member 110.

The rotating member 110 may include the rotating part 110-1 that is inserted into a rotation hole S1 formed on the vertical moving member 120 and rotates, and the coupling part 110-2 that is integrally formed with the rotating part 110-1 and to which the display 10 is coupled.

The rotating part 110-1 may be formed in a circular shape, and the external diameter D1 of the rotating part 110-1 may be smaller than the diameter D2 of the rotation hole S1. Accordingly, the rotating part 110-1 may rotate along the inner circumferential surface of the rotation hole S1 formed in the center portion of the vertical moving member 120.

That is, the rotating part 110-1 may be inserted into the rotation hole S1 formed on the vertical moving member 120 and rotate.

In addition, in the rotating part 110-1, a wiring hole S2 may be formed in the center portion of the rotating part 110-1. Through the wiring hole S2, a cable 40 that connects the display 10 and the driving board 30 that is electronically connected with the display 10 and is arranged inside the stand 200 may pass.

Accordingly, even when the display 10 moves to the first position to the third position and rotates, the cable 40 may not become entangled. Accordingly, through the wiring hole S2, the display 10 may receive signals consistently and stably from the driving board 30.

Also, the wiring hole S2 may reduce the weight that the rotating part 110-1 occupies. Meanwhile, the wiring hole S2 may be formed such that the rotating part 110-1 has rigidity for stably rotating.

The coupling part 110-2 may be formed integrally with the rotating part 110-1 and coupled with the display 10. Specifically, the coupling part 110-2 may be formed on one side of the rotating part 110-1. For example, the coupling part 110-2 may be formed in the upper part (the Z-axis direction) of the rotating part 110-1.

In addition, in the coupling part 110-2, the front surface 110-2a of the coupling part 110-2 may be coupled with the rear surface 10b of the display 10. For example, the coupling part 110-2 may be screw-coupled with the display 10 through a first coupling hole b1 formed on the front surface 110-2a of the coupling part 110-2.

However, the coupling method is not limited to screw-coupling, and there may be various methods of coupling the coupling part 110-2 to the display 10, such as coupling by using an adhesive, a welding method, etc.

Also, the front surface 110-2a of the coupling part 110-2 may be in the form corresponding to the rear surface 10b of the display 10. For example, in case the rear surface 10b of the display 10 is formed as a flat surface, the front surface 110-2a of the coupling part 110-2 may also be formed as a flat surface. In addition, in case the rear surface 10b of the display 10 has specific curve, the front surface 110-2a of the coupling part 110-2 may also have specific curve.

That is, the form of the front surface 110-2a of the coupling part 110-2 may be a complementary form with the form of the rear surface 10b of the display 10.

Accordingly, the coupling part 110-2 may be securely coupled with the display 10, and as the rotating member 110 rotates, the display 10 may also be rotated integrally.

The vertical moving member 120 may be coupled with a pair of guide rails 220 (refer to FIG. 5B) arranged on the stand 200, and slide along the pair of guide rails 220.

Accordingly, the pair of guide rails 220 are arranged in a vertical direction to the stand 200, and thus the vertical moving member 120 may move in a vertical direction with respect to the stand 200.

Specifically, as illustrated in FIG. 3B, in the vertical moving member 120, a plurality of guide rail coupling parts 121-1, 121-2, 121-3, 121-4 may be formed in symmetry with the rotation hole S1 formed in the center portion of the vertical moving member 120.

Also, the plurality of guide rail coupling parts 121-1, 121-2, 121-3, 121-4 may be formed on the rear surface 120b of the vertical moving member 120.

In addition, each of the plurality of guide rail coupling parts 121-1, 121-2, 121-3, 121-4 may be arranged in parallel with each other. For example, the first and second guide rail coupling parts 121-1, 121-2 arranged on the right side with respect to the rotation hole S1 may be arranged to be in a vertically aligned direction with each other. Also, the third and fourth guide rail coupling parts 121-3, 121-4 arranged on the left side with respect to the rotation hole S1 may be arranged to be in a vertically aligned direction with each other.

Further, the first and second guide rail coupling parts 121-1, 121-2 and the third and fourth guide rail coupling parts 121-3, 121-4 may be arranged to horizontally align with one another.

The first guide rail coupling part 121-1 may be coupled with a first rail moving member 221-1 arranged on the first guide rail 220-1, and the second guide rail coupling part 121-2 may be coupled with a second rail moving member 221-2 arranged on the first guide rail 220-1.

Similarly, the third guide rail coupling part 121-3 may be coupled with a third rail moving member 221-3 arranged on the second guide rail 220-2, and the fourth guide rail coupling part 121-4 may be coupled with a fourth rail moving member 221-4 arranged on the second guide rail 220-2. Accordingly, the vertical moving member 120 may be coupled with a pair of guide rails 220.

Here, each of the plurality of guide rail coupling parts 121-1, 121-2, 121-3, 121-4 may be coupled with each of the plurality of rail moving members 221 through a second coupling hole b2 formed on each of the plurality of guide rail coupling parts 121. However, the coupling method is not limited to screw-coupling, and there may be various methods of coupling the vertical moving member 120 to the guide rails 220, such as by using an adhesive, a welding method, etc.

Accordingly, the vertical moving member 120 may move in a vertical direction along a pair of guide rails 220.

That is, considering that the vertical moving member 120 has a structure of being connected to the rotating member 110 connected to the display 10, as the vertical moving member 120 moves in a vertical direction along the stand 200, the display 10 may move in a vertical direction relative to the stand 200.

Also, the vertical moving member 120 may include a belt insertion part 122 that is arranged on one side of the vertical moving member 120 and into which the driving belt 272 is inserted.

Here, the one side of the vertical moving member 120 for housing the belt insertion part 122 may be the left side portion or the right side portion of the vertical moving member 120. Also, the belt insertion part 122 may be formed in the left side portion or the right side portion of the vertical moving member 120 according to the location at which the driving belt 272 of the driving part 270 is arranged.

For example, in a configuration in which the driving belt 272 is arranged in the left side portion of the vertical moving member 120, the belt insertion part 122 may be arranged in the left side portion of the vertical moving member 120.

In addition, the vertical moving member 120 may include a belt coupling part 123 that is coupled with the belt insertion part 122 and at which a coupling gear 123*t* coupled with the driving belt 272 is formed.

Specifically, one surface of the driving belt 272 may be inserted into the belt accommodating groove 122*b* of the belt insertion part 122, and the other surface of the driving belt 272 may be coupled with the coupling gear 123*t* of the belt coupling part 123.

Accordingly, the driving belt 272 may be inserted into a space formed by the belt insertion part 122 and the belt coupling part 123, and may be fixed to the vertical moving member 120 by the coupling gear 123*t*.

Thus, in case the driving belt 272 is inserted into the belt insertion part 122 and is driven in a vertical direction integrally with the belt coupling part 123, the vertical moving member 120 may also move in a vertical direction. That is, considering that the vertical moving member 120 is coupled with the rotating member 110 connected to the display 10, as the vertical moving member 120 moves in a vertical direction, the display 10 may move in a vertical direction relative to the stand 200.

That is, in case the driving belt 272 is connected to a motor 271, as a user controls an operation of the motor 271, the driving belt 272 may be driven in a first direction R1 (refer to FIG. 7C) and move in a second direction R2 (refer to FIG. 7C) opposite to the first direction, and thereby control the movement and rotation of the display 10.

Likewise, the driving belt 272 may transmit the power source of the motor 271 to the connecting member 100, and thereby provide for the movement of the display 10.

Also, the connecting member 100 may include a connecting ring 130 that is arranged between the rotation hole S1 and the rotating part 110-1 and connects the rotation hole S1 and the rotating part 110-1.

The connecting ring 130 may be formed in a ring shape, and the diameter of the outer circumference thereof may be smaller than the diameter D2 of the rotation hole S1, and the diameter of the inner circumference thereof may be bigger than the external diameter D1 of the rotating part 110-1.

Accordingly, the outer circumferential surface of the connecting ring 130 may contact the inner circumferential surface of the rotation hole S1 of the vertical moving member 120, and the inner circumferential surface of the connecting ring 130 may contact the outer circumferential surface of the rotating part 110-1.

Thus, the rotating part 110-1 may be located stably inside the rotation hole S1 of the vertical moving member 120. Also, in case the rotating part 110-1 rotates inside the rotation hole S1 of the vertical moving member 120, the connecting ring 130 may adjust friction with the rotating part 110-1, and thereby adjust the rotating speed of the rotating member 110 with respect to the vertical moving member 120. That is, the connecting ring 130 may adjust the rotating speed of the display 10 with respect to the stand 200.

In addition, the connecting ring 130 may arrange the rotating part 110-1 stably inside the rotation hole S1, and thus the rotating part 110-1 and the vertical moving member 120 may be located on the same plane.

Thus, the connecting ring 130 may prevent the rotating member 110 from being spaced apart from the vertical moving member 120, and minimalize the coupled structure of the rotating member 110 and the vertical moving member 120 in terms of space. Accordingly, the space in which the display 10 and the stand 200 are coupled is minimized, and the display apparatus 1 may be implemented to have a slim form factor.

Also, the connecting ring 130 may be a bearing inserted into the rotation hole S1.

The connecting member 100 may include a knob 111 that is coupled with one surface of the connecting member 100, and is inserted into a guide slot 211 (refer to FIG. 5B) of the guide member 210 and moves along the guide slot 211.

For example, as illustrated in FIGS. 3B and 4B, the knob 111 may be arranged on the rear surface 110-1*b* of the rotating part 110-1.

Accordingly, as the knob 111 moves in a specific direction, the connecting member 100 may move, and as the knob 111 rotates in a specific direction, the rotating member 110 of the connecting member 100 may rotate.

For example, in the configuration in which the knob 111 moves along the first portion 211-1 of the guide slot 211 that is vertically formed, the vertical moving member 120 and the connecting member 100 including the vertical moving member 120 may move in a vertical direction. Here, the rotating member 110 moves vertically together with the vertical moving member 120, but does not rotate.

Accordingly, as the connecting member 100 moves in a vertical direction, the display 10 connected with the connecting member 100 may move in a vertical direction relative to the stand 200.

Also, in the configuration in which the knob 111 moves along the second portion 211-2 of the guide slot 211 that is formed to be bent, the rotating member 110 may rotate in a predetermined direction. Here, only the rotating member 110 rotates, and the vertical moving member 120 does not rotate.

Accordingly, as the rotating member 110 of the connecting member 100 rotates in a predetermined direction, the display 10 connected with the connecting member 100 may rotate in a predetermined direction with respect to the stand 200.

Meanwhile, the diameter of the knob 111 may be formed to be smaller than or the same as the width of the guide slot 211. Also, the knob 111 and the guide slot 211 are slide-coupled, and thus the knob 111 may move naturally along the guide slot 211.

That is, the knob 111 may adjust the movement and rotation of the connecting member 100 and the display 10 connected with the connecting member 100 in a vertical direction with respect to the stand 200.

Hereinafter, the detailed configuration of the stand 200 according to an embodiment of the disclosure will be described with reference to FIGS. 5A to 7D.

Figure 5A:
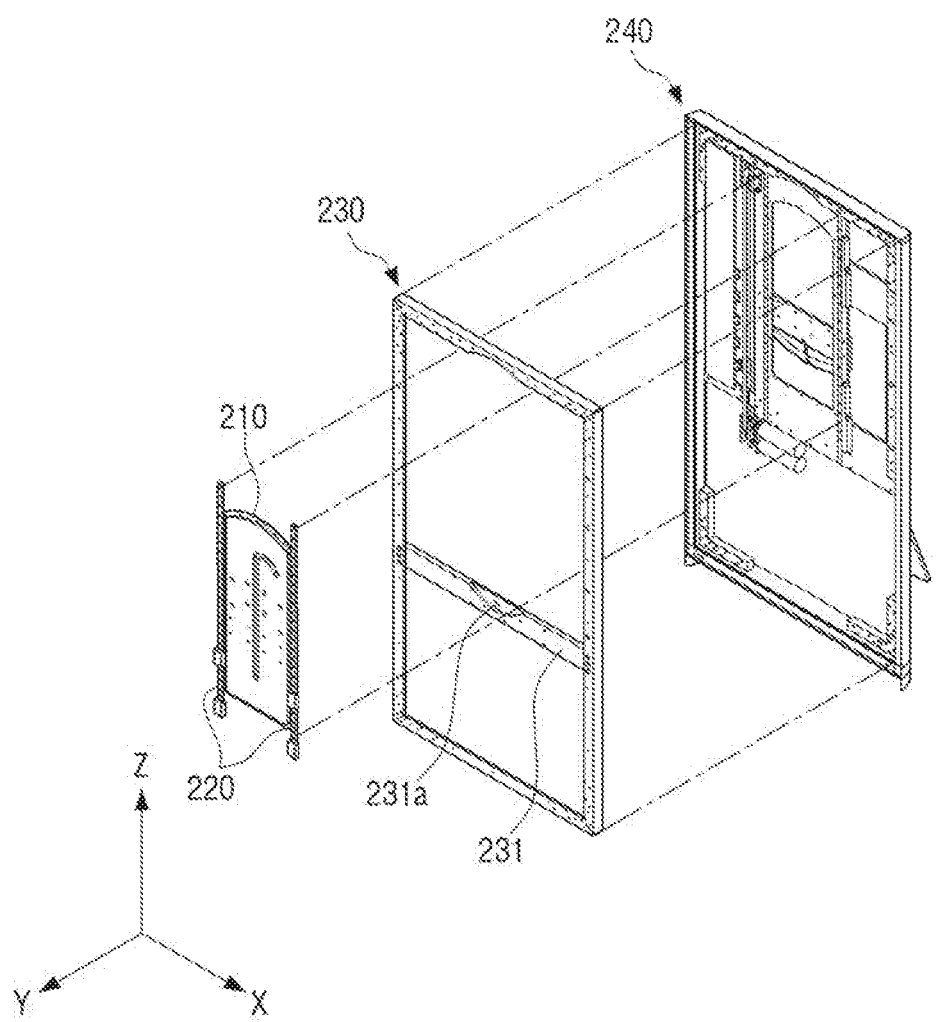
FIG. 5A is an exploded perspective view of a stand according to an embodiment of the disclosure.
Figure 5B:
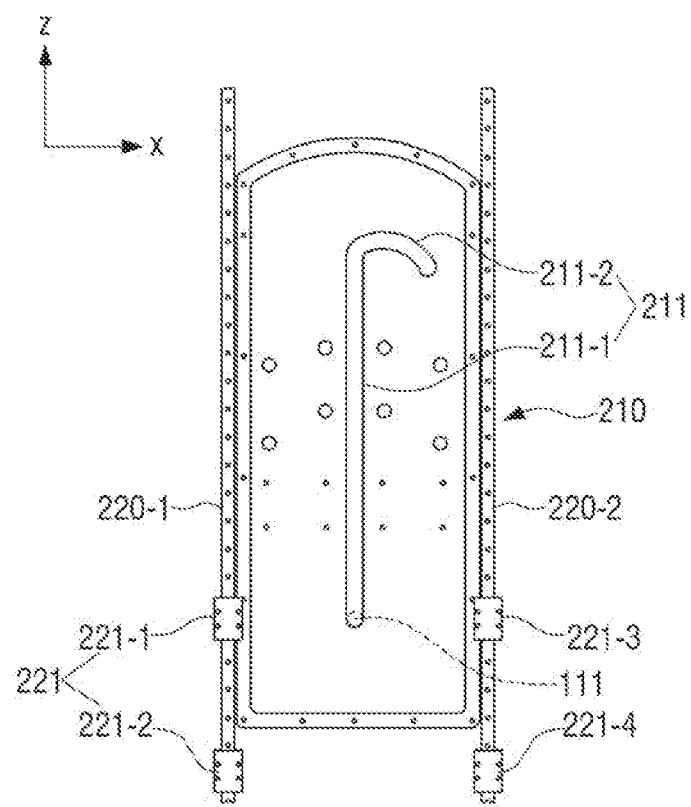
FIG. 5B is a front view illustrating a guide member and a pair of guide rails according to an embodiment of the disclosure.

FIG. 5A is an exploded perspective view of the stand 200 according to an embodiment of the disclosure, and FIG. 5B is a front view illustrating the guide member 210 and a pair of guide rails 220 according to an embodiment of the disclosure.

The stand 200 may be arranged on the rear side of the display 10, and support the display 10. Also, the stand 200 may include a guide member 210 that is arranged on the stand 200 and guides the movements of the connecting member 100 and the display 10, a pair of guide rails 220 arranged in a vertical direction to the stand 200, a frame member 230 arranged along the edge of the stand 200, a housing 240 forming the exterior of the rear surface of the display apparatus 1, and a speaker 250 arranged in the lower part of the stand 200.

In the guide member 210, a guide slot 211 into which the knob 111 is inserted and moves may be formed. The guide slot 211 may be formed in the center portion of the stand 200, but the guide slot 211 may be formed on the left side or the right side of the stand.

The guide member 210 may guide the movement and rotation of the display 10 with respect to the stand 200.

Specifically, as the knob 111 of the connecting member 100 connected to the display 10 moves along the guide slot 211, the display 10 may move in a vertical direction or in a predetermined direction.

Into the guide slot 211, the knob 111 of the connecting member 100 may be inserted, and move the connecting member 100 and the display 10.

Also, the guide slot 211 may include a first portion 211-1 formed in a vertical direction and a second portion 211-2 that is consecutively connected to the upper end of the first portion 211-1 and is bent in a predetermined direction that is other than the vertical direction, thereby causing rotation of the display 10.

Here, a predetermined direction means the direction in which the display 10 rotates with respect to the stand 200, and the direction of rotation may be a clockwise direction or a counter clockwise direction.

For example, in a configuration in which the second portion 211-2 is formed to be bent in a clockwise direction, the display 10 may rotate in a clockwise direction with respect to the stand 200. Likewise, in case the second portion 211-2 is formed to be bent in a counter clockwise direction, the display 10 may rotate in a counter clockwise direction with respect to the stand 200.

The first portion 211-1 may be formed in a vertical direction. Accordingly, in a configuration in which the knob 111 moves along the first portion 211-1, the display 10 may move in a vertical direction with respect to the stand 200.

The second portion 211-2 may be consecutively connected to the first portion 211-1, and may be bent or curved in a predetermined direction. For example, the second portion 211-2 may be in the form of an arc equal to or smaller than 180 degrees. Accordingly, in case the knob 111 moves by 180 degrees along the second portion 211-2, the display 10 may rotate by 90 degrees with respect to the stand 200. The shape of the second portion 211-2 may include any shape that causes rotation of the display 10 when the knob 111 slides along the second portion 211-2. The shapes may include angles, arcs, or any combination regular or irregular shapes that induces rotation of the display 10 when the knob 111 slides along the second portion 211-2.

That is, one end 211-2a (refer to FIG. 10A) of the second portion 211-2 is arranged to be bent by 90 degrees with respect to the first portion 211-1. Accordingly, in a configuration in which the knob 111 is arranged on one end 211-2a of the second portion 211-2 from the first portion 211-1, the knob 111 is ultimately rotated by 90 degrees. Thus, the display 10 may rotate by 90 degrees with respect to the stand 200.

In addition, the curvature of the second portion 211-2 may vary depending on design, but for the stable rotating operation of the display 10, the arc constituting the second portion 211-2 may be a portion of a semicircle to provide for a smooth rotation throughout the extent of the shape of the second portion 211-2.

Accordingly, the guide member 210 may rotate the connecting member 100 and the display 10 connected with the connecting member 100 in a vertical direction or a predetermined direction with respect to the stand 200 through the mechanism of the guide slot 211.

Meanwhile, the guide rail 220 may be arranged in a vertical direction with respect to the stand 200, and the guide rail 220 may be connected with the connecting member 100 and guide the connecting member 100 in a vertical direction.

Specifically, the guide rail 220 may include a rail moving member 221 that is slide-coupled with the guide rail 220. In addition, the rail moving member 221 may be coupled with the guide rail coupling part 121-1, 121-2, 121-3, 121-4 of the vertical moving member 120.

For example, the guide rail 220 may consist of a pair of guide rails 220-1, 220-2 arranged to constitute symmetry with the guide member 210 at the center.

Also, the first guide rail coupling part 121-1 may be coupled with the first rail moving member 221-1 arranged on the first guide rail 220-1, and the second guide rail coupling part 121-2 may be coupled with the second rail moving member 221-2 arranged on the first guide rail 220-1.

Likewise, the third guide rail coupling part 121-3 may be coupled with the third rail moving member 221-3 arranged on the second guide rail 220-2, and the fourth guide rail coupling part 121-4 may be coupled with the fourth rail moving member 221-4 arranged on the second guide rail 220-2. That is, the vertical moving member 120 may be coupled with a pair of guide rails 220.

Accordingly, the vertical moving member 120 may move in a vertical direction along a pair of guide rails 220 arranged in a vertical direction.

Also, the vertical moving member 120 is connected with each of the pair of guide rails 220 symmetrically with the rotation hole S1 in the center. Thus, the vertical moving member 120 may move in a vertical direction in parallel, without being tilted in a direction of one side.

The frame member 230 may be arranged inside the housing 240 of the stand 200, and stably support the exterior of the stand 200.

Specifically, in case the display 10 moves or rotates as the frame member 230 supports the weight of the display 10 itself, the display apparatus 1 may not be tilted or fall in one direction.

Also, the frame member 230 may distribute the weight of the display 10, and thereby prevent deformation of the exterior of the stand 200 due to the weight of the display 10.

In addition, the stand 200 may include a supporting member 231 that is connected with the frame member 230, and supports the connecting member 100 in the first position.

Figure 6:
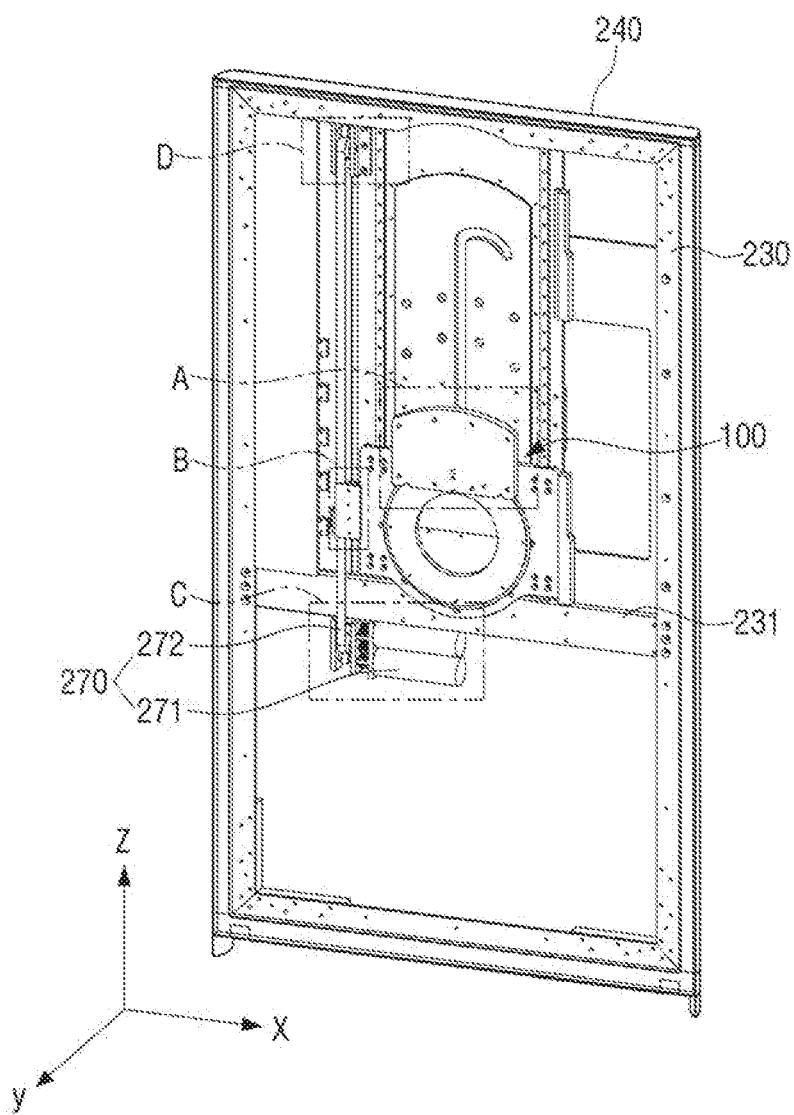
FIG. 6 is a combined perspective view of a connecting member and a stand according to an embodiment of the disclosure.

Specifically, the supporting member 231 is arranged to cross over the frame member 230 in a horizontal direction, and as illustrated in FIG. 6, the supporting member 231 may contact the lower surface of the vertical moving member 120 in the first position.

Accordingly, the supporting member 231 may distribute the load of the display 10 transmitted to the vertical moving member 120 by supporting the vertical moving member 120.

Also, the supporting member 231 may include a supporting groove 231*a* that is complementary with the form of the lower part of the vertical moving member 120. For example, in case the lower part of the vertical moving member 120 has a specific curvature, the supporting groove 231*a* may be formed to also have a specific curvature.

Accordingly, as the vertical moving member 120 contacts the supporting groove 231*a*, the load of the display 10 transmitted to the vertical moving member 120 may be distributed more stably.

The housing 240 may form the exterior of the stand 200, and protect several components arranged inside the stand 200 from external foreign substances.

For example, the guide member 210, a pair of guide rails 220, the driving part 270, the speaker 250, etc. arranged inside the stand 200 may be protected from the outside, and thus durability of the display apparatus 1 can be improved.

The form of the housing 240 may be diverse, but the housing 240 may be formed such that the size of one surface 200*a* of the stand 200 is the same as the size of the cross section of the display 10.

For example, in a configuration in which the display 10 is formed having the first length L and the second length W, the stand 200 and the housing 240 constituting the exterior of the stand 200 may also be formed to have dimensions of the first length L and the second length W.

Accordingly, in the first position in which the display 10 covers the lower surface 200-1 of the stand 200, the display 10 and the stand 200 form a matched exterior, and thus a user may perceive a pleasing aesthetic sense of the display apparatus 1.

The speaker 250 is an apparatus that outputs a sound based on a sound signal included with an image signal according to a wave form that can be audibly recognized by a user. As illustrated in FIG. 2A, the speaker 250 may be arranged in the lower part of the stand 200.

Here, the lower part of the stand 200 may mean the area of the stand 200 that is exposed when the display 10 moves from the first position in which the display 10 covers one surface 200*a* of the stand 200 to the second position in which the display 10 is moved in a vertical direction relative to the stand 200. For example, the speaker 250 may be arranged in the rear side of the lower surface 200-1 of the stand 200.

Accordingly, in a configuration in which the display 10 is located in the second position and the third position, in which the display 10 is moved vertically with respect to the stand 200 and rotated with respect to the stand 200, respectively, the speaker 250 of the stand 200 is exposed, and thus a user may be provided with a sound of high output along with an image.

As the speaker 250 arranged inside the stand 200, various types of speakers such as a directional speaker or an omnidirectional speaker may be arranged. Also, a speaker array may be formed as omni-directional speakers are aligned, without being limited to arrangement of a single speaker.

Hereinafter, a configuration wherein the connecting member 100 and the stand 200 are coupled and operations thereof according to an embodiment of the disclosure will be described with reference to FIGS. 6 to 7D.

Figure 7A:
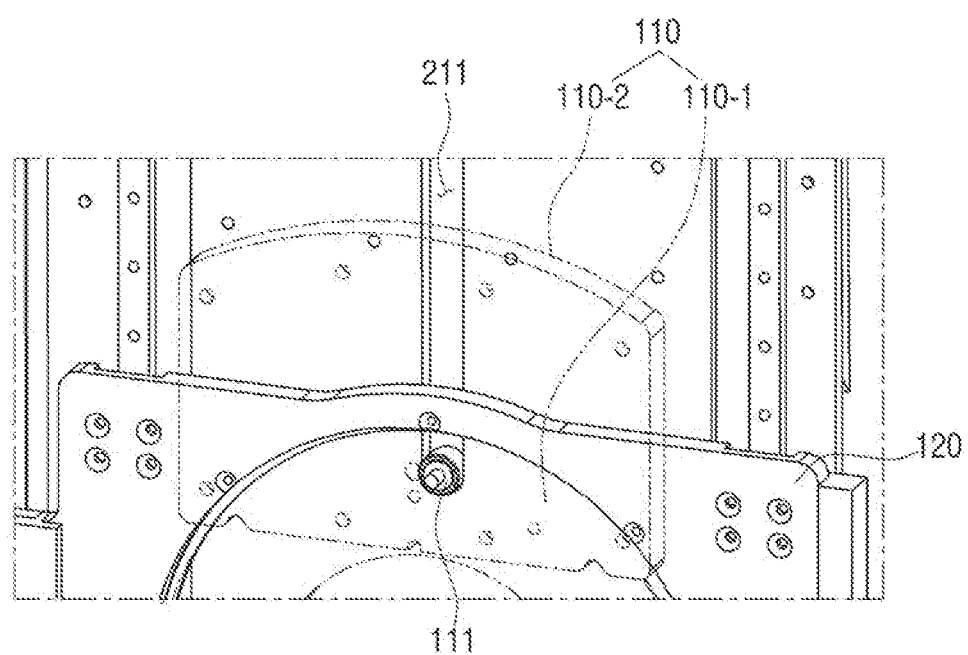
FIG. 7A is an enlarged view illustrating the area A in FIG. 6 according to an embodiment of the disclosure.
Figure 7B:
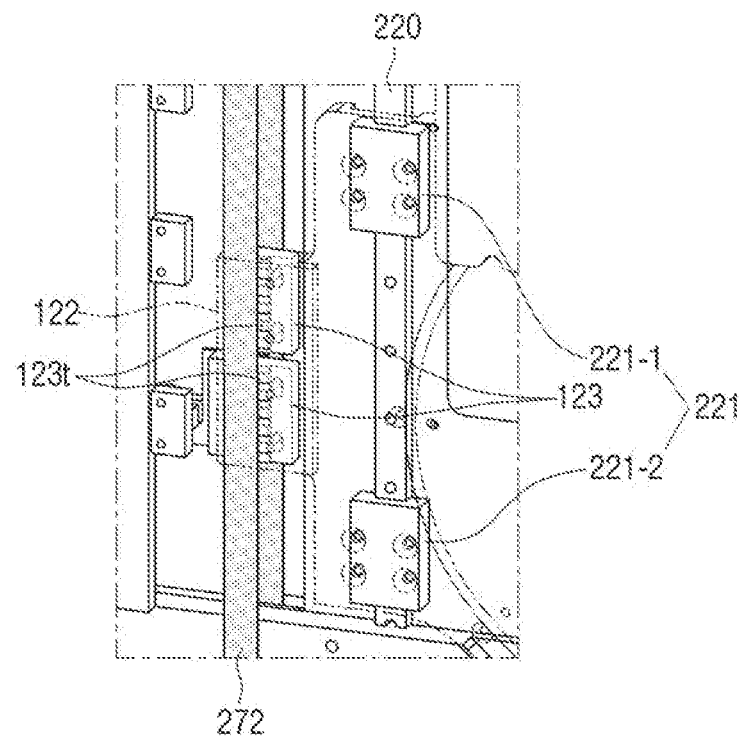
FIG. 7B is an enlarged view illustrating the area B in FIG. 6 according to an embodiment of the disclosure.
Figure 7C:
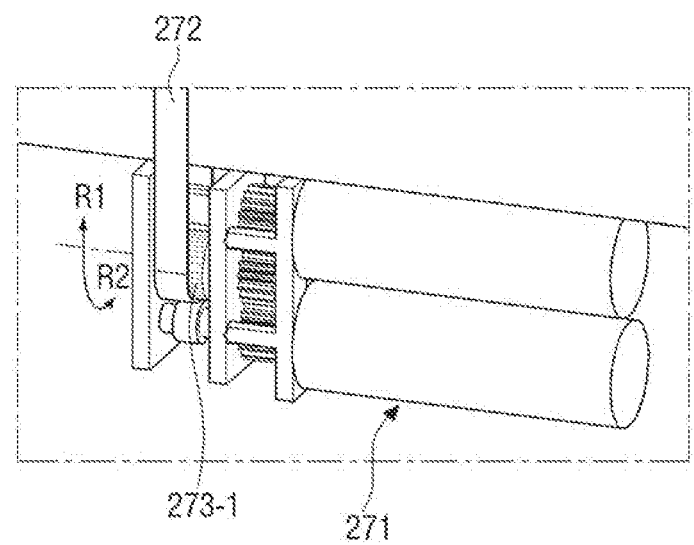
FIG. 7C is an enlarged view illustrating the area C in FIG. 6 according to an embodiment of the disclosure.

FIG. 6 is a combined perspective view of the connecting member 100 and the stand 200 according to an embodiment of the disclosure. FIG. 7A is an enlarged view illustrating the area A in FIG. 6. FIG. 7B is an enlarged view illustrating the area B in FIG. 6. FIG. 7C is an enlarged view illustrating the area C in FIG. 6. FIG. 7D is an enlarged view illustrating the area D in FIG. 6.

Here, in FIG. 7A, the rotating member 110 is illustrated to be transparent, and in FIG. 7B, the connecting member 100 is illustrated to be translucent.

Referring to FIG. 6, the stand 200 may include a driving part 270 that is connected with the connecting member 100 and moves the connecting member 100 between the first position, the second position, and the third position.

The driving part 270 may include a motor 271 and a driving belt 272 that is connected with the motor 271 and is arranged in parallel with a pair of guide rails 220. That is, the driving belt 272 may be arranged in a vertical relationship to the stand 200.

Specifically, as illustrated in FIG. 7B, a portion of the driving belt 272 may be inserted into the belt insertion part 122, and may be coupled with the coupling gear 123*t*.

Thus, the vertical moving member 120 coupled with the driving belt 272 and the connecting member 100 including the vertical moving member 120 may move in parallel with the direction in which the driving belt 272 moves. Accordingly, the power provided from the motor 271 may be transmitted to the vertical moving member 120 by the driving belt 272 without dissipation.

Accordingly, power consumption for moving and rotating the display 10 may be reduced.

Figure 7D:
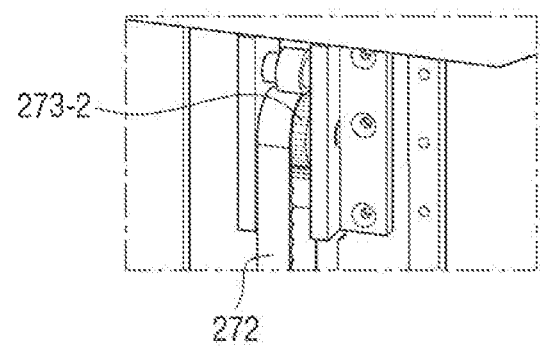
FIG. 7D is an enlarged view illustrating the area D in FIG. 6 according to an embodiment of the disclosure.

Also, as illustrated in FIGS. 7C and 7D, on both ends of the driving belt 272, a first axis 273-1 connected with the motor 271 and rotates and a second axis 273-2 that rotates the driving belt 272 may be respectively arranged.

Accordingly, the driving belt 272 may be connected with the first axis 273-1 and the second axis 273-2 and maintained to have specific tension, and rotate in a first direction R1 and a second direction R2 according to driving of the motor 271.

Specifically, in case the motor 271 consistently rotates the first axis 273-1 in the first direction R1, the connecting member 100 connected with the driving belt 272 ascends in a vertical direction (the P1 direction, refer to FIG. 9A), and as the knob 111 of the connecting member 100 moves in the second portion 211-2 of the guide slot 211, the rotating member 110 of the connecting member 100 rotates (the Q1 direction, refer to FIG. 10A).

That is, in a configuration in which the motor 271 rotates the first axis 273-1 in the first direction R1, the display 10 sequentially moves from the first position to the third position via the second position.

In contrast, in case the motor 271 rotates the first axis 273-1 in the second direction R2, the knob 111 of the connecting member 100 rotates in a direction opposite to one end 211-2*a* of the second portion 211-2 of the guide slot 211 (the Q2 direction, refer to FIG. 10A), and the connecting member 100 descends in a vertical direction (the P2 direction, refer to FIG. 9A).

That is, in case the motor 271 rotates the first axis 273-1 in the second direction R2, the display 10 sequentially moves from the third position to the first position via the second position.

Hereinafter, operations of the display apparatus 1 according to an embodiment of the disclosure will be described in detail with reference to FIGS. 8A to 10B.

Figure 8B:
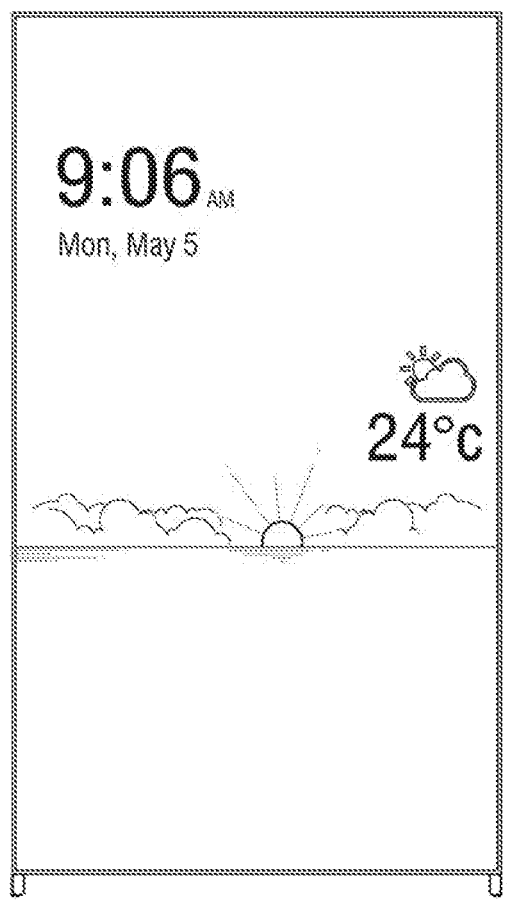
FIG. 8B is a front view illustrating the screen of the display in FIG. 8A according to an embodiment of the disclosure.
Figure 9B:
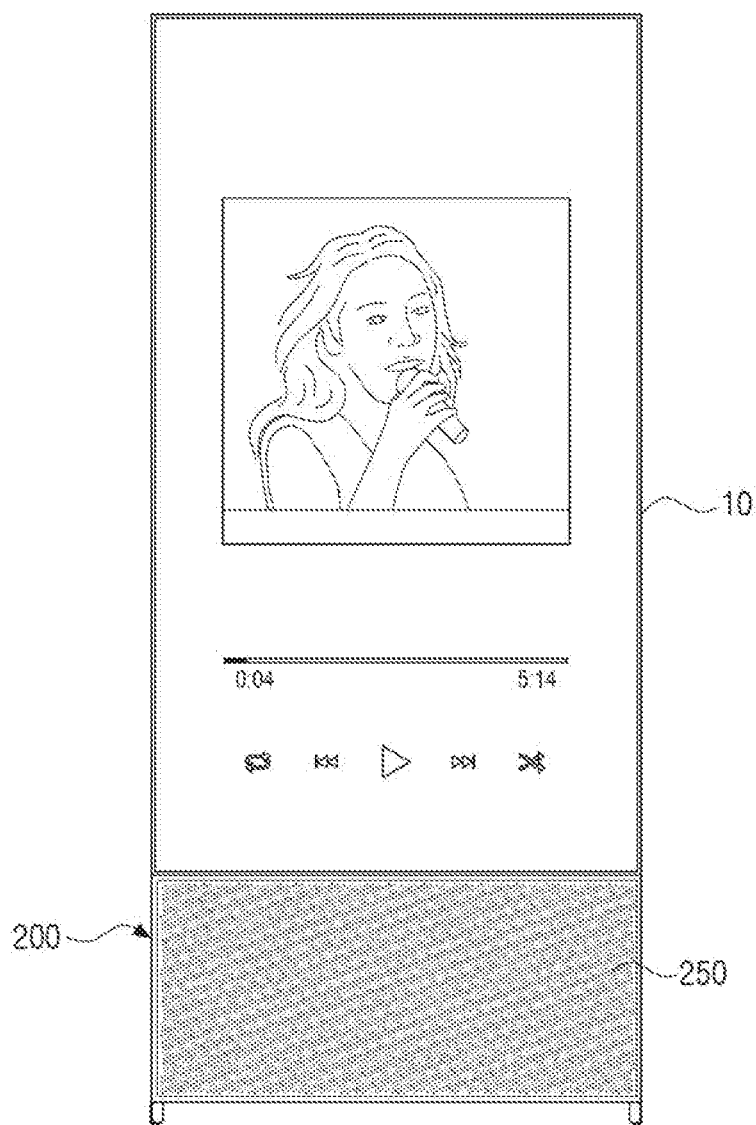
FIG. 9B is a front view illustrating the screen of the display in FIG. 9A according to an embodiment of the disclosure.
Figure 10B:
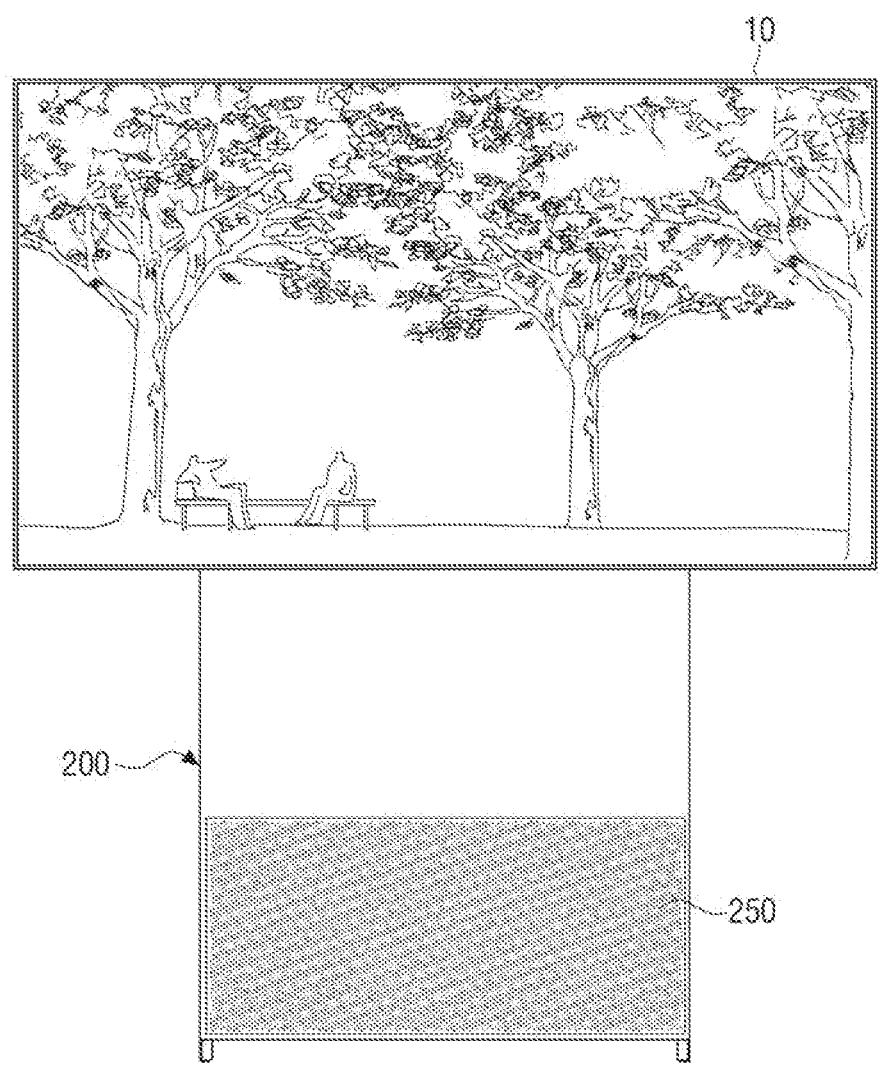
FIG. 10B is a front view illustrating the screen of the display in FIG. 10A according to an embodiment of the disclosure.

FIG. 8A is a front view of the display apparatus 1 in which a first position is indicated according to an embodiment of the disclosure. FIG. 8B is a front view illustrating the screen of the display 10 in FIG. 8A. FIG. 9A is a front view of the display apparatus 1 in which a second position is indicated according to an embodiment of the disclosure. FIG. 9B is a front view illustrating the screen of the display 10 in FIG. 9A. FIG. 10A is a front view of the display apparatus 1 in which a third position is indicated according to an embodiment of the disclosure. FIG. 10B is a front view illustrating the screen of the display 10 in FIG. 10A.

First, as illustrated in FIGS. 8A and 8B, the display 10 may be located in the first position in which the display 10 covers one surface 200a of the stand 200. Thus, the display 10 obscures view of a portion of the stand 200 or all of the stand 200a from view of a user who views the display apparatus 1 from a front side of the display apparatus 1. The portion of the stand 200 obscured by the display 10 may include the speaker 250. Here, the knob 111 may be located in the lower end 211-1a of the first portion 211-1 of the guide slot 211.

In the first position, the display 10 may display simple contents. For example, as illustrated in FIG. 8B, in the first position, the display 10 may display pictures, dates, time, weather, simple contents, etc.

In addition, in case the display apparatus 1 is interlocked with a mobile apparatus of a user, simple contents such as the photographs of the user may be displayed.

Further, in the first position, the speaker 250 may be covered by the display 10. Meanwhile, the speaker 250 may emit simple signal sounds depending on needs.

The image displayed in the first position and the sound emitted in the first position are not limited to the descriptions above. Any image and any sound may be reproduced by the display apparatus 1 in the first position.

Next, as illustrated in FIGS. 9A and 9B, the display 10 may be located in the second position in which the display 10 moved in a vertical direction relative to the stand 200, from the first position. Here, the knob 111 may be located between the first portion 211-1 and the second portion 211-2 of the guide slot 211.

Specifically, as the motor 271 of the driving part 270 rotates the first axis 273-1 in the first direction R1, the driving belt 272 connected with the first axis 273-1 rotates in the first direction R1.

Next, the connecting member 100 connected with the driving belt 272 ascends in a vertical direction (the P1 direction), and the display 10 is located in the second position in which the display 10 moved in a vertical direction to the stand 200.

That is, the motor 271 may move the knob 111 until the knob 111 is located between the first portion 211-1 and the second portion 211-2 from the lower end 211-1a of the first portion 211-1.

In the second position, the display 10 may display image contents that accompany audio contents. For example, as illustrated in FIG. 9B, the display 10 may reproduce image contents appropriate for a vertically oriented screen in the second position.

Here, a vertically oriented screen may mean a display screen of which height from top to bottom is longer than the width from left to right.

In addition, in the second position, the speaker 250 may be exposed as to be unobscured by the display 10. Here, exposure of the speaker 250 may mean that the emission portion of the speaker 250 from which the sound of the speaker 250 is emitted is exposed.

Accordingly, an image content may be reproduced on the display 10, and at the same time, audio content included along with the image content may be emitted through the speaker 250.

Also, in case the display apparatus 1 is interlocked with a mobile apparatus of a user, e.g., a smartphone, the screen of the mobile apparatus of the user may be displayed on the display 10. Accordingly, the user may view the image content on the screen of the mobile apparatus and various types of information through the display apparatus 1, which is a screen larger than the screen of the mobile apparatus of the user, while having a similar aspect ratio to that of the screen of the mobile apparatus.

In addition, in case the display apparatus 1 is interlocked with an external medium, the display apparatus 1 may automatically move from the first position to the second position. For example, in case the display apparatus 1 is interlocked with a mobile apparatus of a user, the display apparatus 1 may move from the first position to the second position, even if there is no separate instruction from the user.

Accordingly, through the movement of the display apparatus 1 to the second position, the user may instantly recognize that the mobile apparatus of the user and the display apparatus 1 are in an interlocked state.

Also, the display apparatus 1 may reproduce music contents, without being limited to image contents. For example, on the display 10, the album jacket, lyrics, etc. of a music content are displayed, and music of high output may be reproduced through the speaker 250 exposed in the second position.

Next, as illustrated in FIGS. 10A to 10B, the display 10 may be located in the third position in which the display 10 is rotated in a predetermined direction from the second position. Here, the knob may be located on one end 211-2a of the second portion 211-2 of the guide slot 211, which may be a terminating end.

Specifically, as the motor 271 of the driving part 270 rotates the first axis 273-1 in the first direction R1, the driving belt 272 connected with the first axis 273-1 rotates in the first direction R1. Next, the rotating member 110 connected with the driving belt 272 through the vertical moving member 120 rotates in the Q1 direction, and the display 10 is located in the third position in which the display 10 moved in a predetermined direction Q1 with respect to the stand 200 from the second position.

In the third position, the display 10 may display image contents that accompany sounds. For example, as illustrated in FIG. 10B, the display 10 may reproduce image contents appropriate for a horizontally oriented screen in the third position.

Here, a horizontally oriented screen may mean a display screen of which length from right to left is longer than the height from top to bottom.

Specifically, in the third position, the display 10 may display image contents having a screen ratio of 16:9, such as movies and dramas.

Also, in the third position, the speaker 250 may be exposed, without being obscured by the display 10. Here, exposure of the speaker 250 may mean that the emission portion of the speaker 250 from which the sound of the speaker 250 is emitted is exposed.

Accordingly, an image content may be reproduced on the display 10, and at the same time, audio content included with the image content may be emitted through the speaker 250.

By virtue of the first position, the second position, and the third position, the display apparatus 1 according to an embodiment of the disclosure may implement a display 10 in configurations of variable width and length through one structure. Accordingly, video content oriented in a vertical direction or a horizontal direction may be appropriately displayed according to aspect ratios thereof.

Also, according to selection of a user, a vertical-type display 10 that suits image contents appropriate for a vertical screen, and a horizontal-type display 10 that suits image contents appropriate for a horizontal screen may be implemented.

In addition, when a user views a content appropriate for a vertical-type screen of a mobile apparatus and then views a horizontal TV, the screen automatically rotates based on detecting the orientation or aspect ratio of the content, and thus the convenience in usage and utilization provided by the display apparatus 1 can be maximized. For example, a processor of the display apparatus 1 may detect the orientation or aspect ratio of the content from metadata of the content, and control to drive the motor to position the display in the first position or the second position corresponding to an aspect ratio of the content to be displayed in the vertical orientation and to position the display in the third position corresponding to an aspect ratio of the content to be displayed in the horizontal orientation.

While the various embodiments of the disclosure have been described separately from one another, the embodiments do not have to be implemented independently, but the configuration and operation of each embodiment may be implemented in combination with at least one other embodiment.

Also, while preferred embodiments of the disclosure have been shown and described, the disclosure is not limited to the aforementioned specific embodiments, and it is understood that various modifications can be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A display apparatus comprising:
   a display;
   a stand configured to support the display;
   a connecting member configured to connect a rear of the display to the stand; and
   a motor,
   wherein the connecting member is configured to guide the display to move relative to the stand between:
      a first position in which the display obscures the stand from view of a user of the display apparatus,
      a second position in which the display is moved from the first position in a vertical direction relative to the stand and a lower portion of the stand is exposed to the view of the user of the display apparatus, and
      a third position in which the display is rotated relative to the stand,
   wherein the stand comprises a speaker arranged in the lower portion of the stand and a pair of guide rails arranged in the vertical direction,
   wherein, in the first position, the display obscures the lower portion of the stand including the speaker from the view of the user of the display apparatus,
   wherein in the second position and the third position, the display does not obscure the lower portion of the stand including the speaker from the view of the user of the display apparatus,
   wherein the motor is configured to move the display from the first position to the second position and rotate the display from the second position to the third position,
   wherein the connecting member comprises:
      a knob coupled with one surface of the connecting member,
      a vertical moving member coupled with the pair of guide rails and configured to move in the vertical direction; and
      a rotating member that is rotatively coupled with the vertical moving member, wherein, the knob is arranged on a first surface of the rotating member, and the display is coupled on a second surface of the rotating member opposing the first surface, and
   wherein the rotating member comprises:
      a rotating part inserted into a rotation hole formed on the vertical moving member and configured to rotate; and
      a coupling part formed integrally with the rotating part and to which the display is coupled.

2. The display apparatus of claim 1, wherein the connecting member comprises a knob coupled with one surface of the connecting member,
   wherein the stand further comprises a guide member in which a guide slot into which the knob is inserted and moves is formed, and
   wherein the guide slot comprises:
      a first portion formed in the vertical direction to guide the display to move in the vertical direction relative to the stand; and
      a second portion connected to an upper end of the first portion and configured to guide the display to rotate relative to the stand.

3. The display apparatus of claim 2, wherein the second portion is in form of an arc equal to or smaller than 180 degrees.

4. The display apparatus of claim 2, wherein, in the first position, the knob is located in a lower end of the first portion,
   wherein in the second position, the knob is located between the first portion and the second portion, and
   wherein in the third position, the knob is located on a terminating end of the second portion.

5. The display apparatus of claim 2, wherein the pair of guide rails are arranged to constitute symmetry with the guide member at a center.

6. The display apparatus of claim 1, wherein the rotating part and the vertical moving member are located on a same plane.

7. The display apparatus of claim 1, further comprising:
   a cable,
   wherein the stand further comprises a driving board that provides images to the display, the cable connecting the display and the driving board, and
   wherein the rotating part includes a wiring hole formed in a center portion of the rotating part, and the cable passes through the wiring hole.

8. The display apparatus of claim 1, further comprising:
   a connecting ring arranged between the rotation hole and the rotating part and configured to connect the rotation hole and the rotating part.

9. The display apparatus of claim 1, wherein the stand further comprises a driving part connected with the connecting member and configured to move the connecting member between the first position, the second position, and the third position, and
   wherein the driving part comprises:
      the motor; and
      a driving belt connected with the motor, and arranged in parallel with the pair of guide rails.

10. The display apparatus of claim 9, wherein the vertical moving member further comprises a belt insertion part arranged on one side thereof, and
- wherein the driving belt is inserted into the belt insertion part and configured to move in the vertical direction.

11. The display apparatus of claim 10, further comprising:
a belt coupling part coupled with the belt insertion part, and in which a coupling gear is formed, and
wherein the driving belt is coupled with the coupling gear, and the belt coupling part and the driving belt move integrally.

12. The display apparatus of claim 1, wherein the stand further comprises:
- a frame member arranged along an edge of the stand; and
- a supporting member connected with the frame member, and configured to support the connecting member in the first position.

13. The display apparatus of claim 1, wherein a height of the display is equal to or longer than a horizontal length of the display, and
- the height of the display is the equal to or greater than a height of the stand.

14. A display apparatus comprising:
- a display;
- a stand;
- a connecting member configured to connect a rear of the display to the stand, wherein the connecting member is configured to guide the display to move relative to the stand between a first position in which the display obscures the stand from view of a user of the display apparatus, a second position in which the display is moved from the first position in a vertical direction relative to the stand and a lower portion of the stand is exposed to the view of the user of the display apparatus, and a third position in which the display is rotated relative to the stand, wherein the connecting member is configured to guide the display to move relative to the stand between the first and the second position in which the display is oriented in a vertical orientation and the third position in which the display is oriented in a horizontal orientation;
- a motor coupled to the connecting member and configured to move the display from the first position to the second position and rotate the display from the second position to the third position; and
- a processor configured to detect an orientation of a content to be displayed on the display and control the motor to drive the display to be guided by the connecting member to the vertical orientation in the first and the second position or the horizontal orientation in the third position based on the orientation of the content to be displayed,
wherein the stand comprises a speaker arranged in the lower portion of the stand,
wherein, in the first position, the display obscures the lower portion of the stand including the speaker from the view of the user of the display apparatus,
wherein in the second position and the third position, the display does not obscure the lower portion of the stand including the speaker is from the view of the user of the display apparatus,
wherein the connecting member comprises a knob coupled with one surface of the connecting member,
wherein the stand further comprises a guide member in which a guide slot into which the knob is inserted and moves is formed, and
wherein the guide slot comprises:
- a first portion formed in the vertical direction to guide the display to move in the vertical direction relative to the stand; and
- a second portion connected to an upper end of the first portion and configured to guide the display to rotate relative to the stand.

* * * * *